United States Patent [19]

Fakruddin et al.

[11] Patent Number: 5,027,294

[45] Date of Patent: Jun. 25, 1991

[54] METHOD AND APPARATUS FOR BATTERY-POWER MANAGEMENT USING LOAD-COMPENSATION MONITORING OF BATTERY DISCHARGE

[75] Inventors: Saifee Fakruddin, St. Joseph; Mark J. Foster, Stevensville, both of Mich.

[73] Assignee: Zenith Data Systems Corporation, Mt. Prospect, Ill.

[21] Appl. No.: 303,604

[22] Filed: Jan. 27, 1989

[51] Int. Cl.$^5$ .................... G01R 29/00; G08B 21/50
[52] U.S. Cl. ................................ 364/550; 364/483; 340/636; 324/426; 324/433; 324/429; 320/48
[58] Field of Search ................ 364/550, 551.01, 480, 364/481, 483, 200, 900; 324/426, 427, 429, 433, 434, 142; 340/636; 365/228, 229; 320/48

[56] References Cited

U.S. PATENT DOCUMENTS

| | | | |
|---|---|---|---|
| 3,781,657 | 12/1973 | Dennstedt | 324/426 |
| 4,333,149 | 1/1982 | Taylor et al. | 320/48 X |
| 4,553,081 | 11/1985 | Koenck | 340/636 X |
| 4,595,880 | 6/1986 | Patil | 364/483 X |
| 4,659,994 | 4/1987 | Poljak | 324/427 X |
| 4,677,363 | 6/1987 | Kopmann | 320/48 X |
| 4,709,202 | 11/1987 | Koenck et al. | 340/636 X |
| 4,827,220 | 5/1989 | Figh | 324/426 |

FOREIGN PATENT DOCUMENTS 0164890 12/1985 European Pat. Off. .............. 320/48

*Primary Examiner*—Joseph L. Dixon
*Attorney, Agent, or Firm*—Augustas Douvas; John Paniaguas; Chuck MacKinnon

[57] ABSTRACT

A method and apparatus for monitoring the voltage discharge of a battery power supply while under load, and to manage the power supply by accurately calculating the time the useful charge is nearly depleted, providing a series of warnings to the user-operator of that fact, and subsequently performing a system shutdown before a complete discharge of the battery. If the invention is applied to a battery power supply for a computer, the series of warnings enable the computer operator to transfer data from a temporary memory to permanent storage in the time interval between a warning signal and computer shutdown; and since computer shutdown is effected before the battery is fully discharged a battery-destructive phenomenon known as a polarity cell reversal is prevented. The battey monitoring and management techniques disclosed comprise generating periodically at a first rate a voltage-discharge value (SS) indicative of the rate of change of battery discharge voltage with respect to the elapse of time while the battery power supply is under load, generating periodically at the first rate a compensation-factor value (CF) which is numerically larger in absolute value than the absolute value of SS during at least the initial portion of the startup voltage depression and which is thereafter periodically decremented at a second rate until CF reaches a predetermined fixed value (FCF) approaching the SS of the stable section of the voltage discharge curve, and generating periodically at the first rate a real-time compensated voltage-discharge value (CSAV) in accordance with the functional expression:

Real-time $CSAV =$ $(f)$ [$SS - CF$ (both values previously taken and adjusted one period earlier at the first rate)] —

[$SS - CF$ (both values taken in real time)].

The real-time CSAV(s) determine the particular battery management step taken.

67 Claims, 12 Drawing Sheets

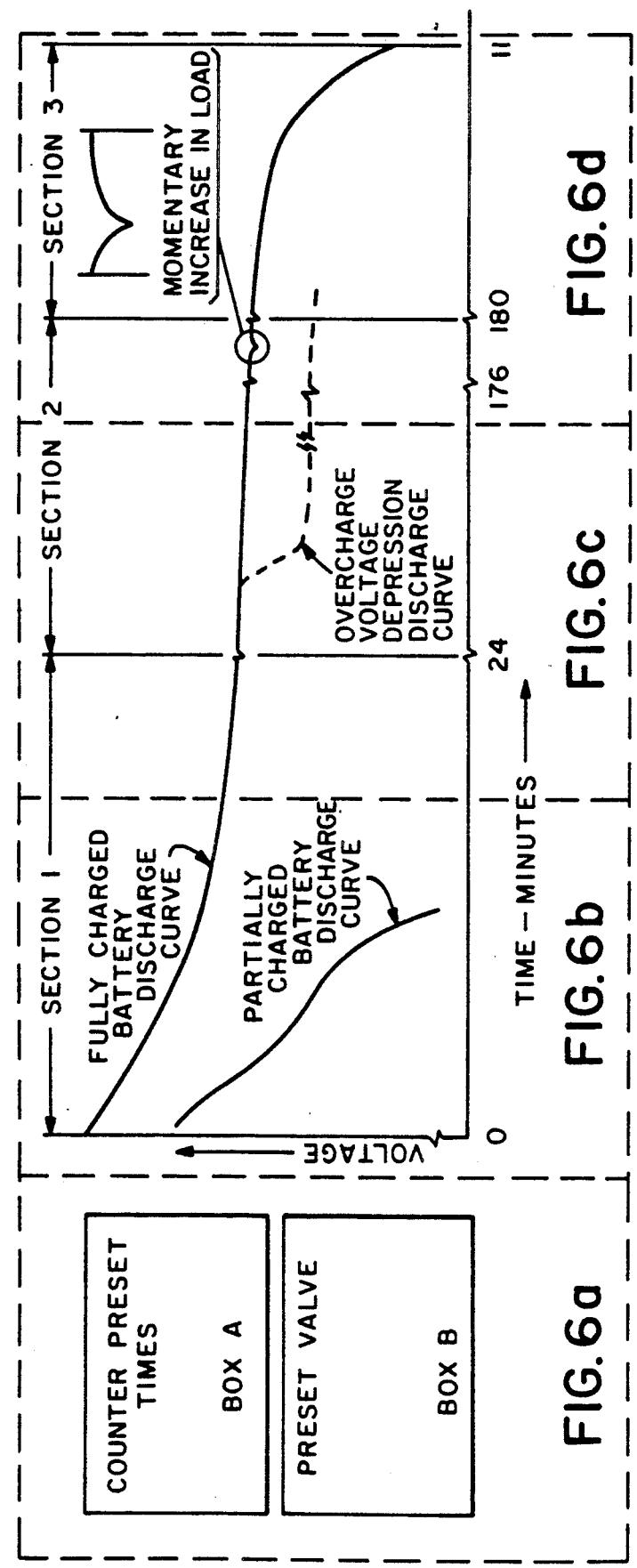

BOX A – COUNTER PRESET TIMES

1. VOLTAGE SAMPLE COUNTER 17 = TIME PERIOD TO TAKE 1 VS
   i.e. ≈ 0.11 SECONDS.

2. STARTUP COMPENSATION COUNTER-TIMER 18 ≈ 1/16 TIME PERIOD OF STARTUP VOLTAGE DEPRESSION SECTION 1
   i.e. ≈ 90 SECONDS.

3. WARNING COUNTER 19 ≈ TIME PERIOD OF THE OVERCHARGE DEPRESSION KNEE RANGE
   i.e. ≈ 180 SECONDS, OR
   ≈ 6 SS TIMES.

NOTE: TIME REQUIRED TO TAKE SS = 30 SECONDS, OR 256 TIME PEROIDS TO TAKE 1 VS OF .11 SECONDS.

BOX B – PRESET VALUES

1. SCF ≈ 20, OR (1/2 ABSOLUTE VALUE OF THE SUM OF SS(S) OCCURRING DURING THE FIRST 1/4 OF THE TIME PERIOD OF SECTION 1).

2. FCF ≈ 1 DURING STABLE SECTION 2 & KNEE SECTION 3. FCF ≈ (ABSOLUTE VALUE OF SS(S) AT ANY POINT ON SECTION 2) X 4.

3. WARNING LEVEL 1 ≈ 2, OR (AVERAGE OF THE ABSOLUTE VALUE OF ALL SS(S) OVER THE INITIAL 36% OF KNEE SECTION 3).

4. WARNING LEVEL 2 ≈ 22, OR ≈ (ABSOLUTE VALUE OF SUM OF SS(S) OF ≈ INITIAL 81% OF KNEE SECTION 3).

5. SDV ≈ 56, OR ≈ (ABSOLUTE VALUE OF SUM OF SS(S) OVER THE LAST 19% OF KNEE SECTION 3).

6. SCAV = 0

```
        CF VALUE FROM STATE U ──
              SS FROM STATE J ──
   CURRENT CSAV FROM STATE N ──
PREVIOUS ADJUSTED CSAV FOR NEXT CSAV CALCULATION
30 SECONDS LATER; OBTAINED FROM STATE N IF
CURRENT CSAV TAKEN 30 SECONDS EARLIER FROM STATE
N>0; OR OBTAINED FROM STATE P IF ≤ 0

CF VALUE FROM STATE U ──
         SLOPE SS FROM STATE J ──
   CURRENT CSAV VALUE FROM STATE N ──
PREVIOUS ADJUSTED CSAV VALUE FROM STATE N OR P ──
```

FIG.6a

METHOD AND APPARATUS FOR BATTERY-POWER MANAGEMENT USING LOAD-COMPENSATION MONITORING OF BATTERY DISCHARGE

INTRODUCTION

This invention relates to a method and apparatus for improved battery-power management using load-compensation monitoring of battery discharge.

The invention is particularly adapted to monitor battery-energy discharge in laptop computers with greater accuracy by compensating for most types of error-inducing variations which would otherwise cause the monitoring process to produce a false output control function with a possible loss of data. If such an erroneous control permits the battery power supply to discharge completely, the operating life of the battery can also be shortened due to a phenomenon known as polarity reversal in the first battery cell to reach zero potential.

Accordingly, this invention maximizes battery life by accurately calculating the point at which the useful charge of a battery power supply has been nearly depleted, providing a series of warnings to the user of this fact, and subsequently performing a system shutdown before complete discharge occurs. If the invention is applied to a battery power supply used by a computer, the series of warnings enable the computer operator to transfer data from a temporary memory to permanent storage in the time interval between a warning signal and computer shutdown.

BACKGROUND OF THE INVENTION

A rechargeable nickel-cadmium battery stores electrical energy and makes this stored electrical energy available during discharge. The energy discharge performance characteristic may vary from one battery to another due to application-related factors, differences in the design of the cell, differences in its internal construction, and the condition of actual use of the battery. In all these cases of variable discharge performance, the nickel-cadmium battery maintains its charge (load-carrying capacity) until very near the end of its useful charge period, then discharges rapidly to a completely discharged level within a few minutes. Detecting the point at which the battery is about to discharge completely in all of the varying situations presents a formidable but important challenge, as complete discharge of a battery greatly shortens its useful life.

Traditional approaches to monitoring the rechargeable battery-energy discharge have been to either use fixed voltage levels to indicate the battery's useful charge period, or to use the rate of change of voltage (slope) as an indicator of the rate of discharge of energy. In applications, such as computer systems, these traditional approaches to battery power monitoring become impractical and unreliable because a rapidly declining rate of change of voltage often occurs long before a battery's useful output is about to be dissipated.

In particular, large negative slopes, which simulate the negative slope values that occur shortly before complete battery discharge, can be caused by 1) varying load conditions on the battery, for example, due to disk accesses, 2) cell dropout, 3) startup voltage depression, and 4) overcharge voltage depression.

A reliable battery power management system should be capable of distinguishing among the various causes of large battery discharge negative slopes and effect warnings and shutdown only in response to imminent complete battery discharge.

OBJECTS OF THE INVENTION

A first principal object of this invention is to enable an operator of a battery powered computer to have a sufficient and reliable warning that computer shutdown is imminent due to loss of battery power so that data can be transferred from temporary memory to permanent storage.

A second principal object of the invention is to maximize the useful life of a battery by improved monitoring of battery discharge so as to prevent cell reversal.

Another object is to improve the monitoring of battery discharge by compensating for certain irrelevant variations in battery output voltage which would otherwise cause a false output control function, such as premature system shutdown.

Another object is to reliably shut down a battery powered computer to remove all load before any of the cells making the battery becomes completely drained.

Another object is to provide reliable warnings that battery power is progressively becoming low.

Another object is to provide a reliable warning that a battery power supply has entered into a state of overcharge voltage depression.

SUMMARY OF THE INVENTION

The invention is designed to monitor the voltage-discharge curve of a battery cell, particularly the nickel-cadmium cell.

The ideal voltage-discharge characteristic curve (voltage vs. both capacity and run time) of a rechargeable single cell battery which is fully charged under fixed load conditions consists of three distinctly defined sections. These sections in time sequence are an initial Startup Voltage Depression (Section 1 in drawings), an intermediate Stable Section (Section 2), and a final Knee Section (Section 3).

During the startup phase, the voltage drops off rapidly for a short duration. At the end of this initial section, the voltage drops off more slowly, by entering into an intermediate relatively-flat stable section of relatively long time duration. The stable section terminates by leading into a knee section in which the voltage drops off rapidly to full discharge.

A reliable battery power management system must be able to distinguish the large negative voltage-discharge slopes which are characteristic of a Section 3 knee from similar negative slope values which may occur long before a Section 3 knee appears. Without such an ability in a battery power management system, the monitoring circuitry might erroneously respond prematurely to a large negative slope value caused by, for example, a startup voltage depression, an overcharge voltage depression, momentary application of a heavy load, poor voltage regulation, or cell dropout.

Accordingly, the structure of this invention is designed to detect and distinguish all such different negative slopes, and to respond with warnings and computer shutdown only upon the occurrence of a negative voltage-discharge slope identifying a Section 3 discharge knee, that is the knee immediately preceding complete discharge of a partially charged battery. This design objective is attained by use of a synthetic empirically-determined factor herein termed "compensation factor"

(CF). The compensation factor has a dynamic changing value throughout most of the Startup Voltage Depression (Section 1) with its actual values being established by an analysis of the voltage-discharge slope values of the discharge curve specified by the battery manufacturer.

In general, the startup compensation factor value (SCF) established at computer powerup, is several times larger than the largest negative slope encountered during the initial period of the startup voltage depression. For example, the actual startup slope may be a $-4$ (all numerical values are arbitrarily selected throughout this specification to simplify and clarify the explanation of the underlying theory of operation) but the compensation factor is a $+20$.

The following preferred battery power management equation is employed in the algorithm of this invention, namely $$\text{Current CSAV} = \text{Previous Adjusted CSAV} \pm |\text{New SS}| - \text{CF}.$$

The values of the term "Current CSAV" determine in general whether warnings followed by computer shutdown ensue. A numerical value is calculated for Current CSAV every 30 seconds. Current CSAV (compensated slope accumulator value) must equal or exceed $+2$, equal or exceed $+22$, and equal or exceed $+56$ for a first warning, a second warning and computer shutdown trigger levels to be attained, respectively. Any Current CSAV equal to or greater than $+2$ will start a warning counter having a time period of 180 seconds. The Current CSAV value calculated at the end of this 180 second time period determines the state of the circuitry. If the battery discharge is at the Knee Section 3 of the discharge curve, the then Current CSAV will be $+2$ or more. If between $+2$ and less than $+22$, a Level 1 warning will be generated. If between $+22$ and less than $+56$ a Level 2 warning will be generated; and if $+56$ or over, computer shutdown will be effected.

If the computer battery supply is fully charged at computer powerup, a Level 1 warning will be generated 180 seconds after a warning counter is started after a Current CSAV of $+2$ and less than $+22$ is calculated Thereafter voltage-discharge slope samples (SS) are calculated every 30 seconds, and when the ever larger negative slopes generate a Current CSAV of between 22 and less than 56 a Level 2 warning is immediately generated. This Level 2 warning may occur at one or more integral multiples of 30 seconds after a Level 1 warning is rendered. Similarly, when the Current CSAV attains a $+56$ or more value, computer shutdown is immediately effected.

If after the warning level counter is started in response to a Current CSAV of $+2$ or more, the Current CSAV drops below a $+2$ at the warning counter time-out period of 180 seconds, then the circuitry is returned to its pre-warning state. The circuit requirement that the Current CSAV be at $+2$ or more both at the beginning and the end of a 180 second time period prevents erroneous warnings being generated in response to negative voltage-discharge slope values generated in response to the application of heavy computer loads, which produce current CSAV(s) of $+2$ or more for a time period of substantially less than 180 seconds, such as disk drives. However, if the Current CSAV is at $+2$ or more even after the 180 seconds time period but is gradually declining, which would be the case for voltage depression due to successive overcharge or cell dropout, a Level 1 warning is triggered to make the user aware of the condition. A Level 2 warning is not subsequently triggered, however, because the circuitry is returned to its prewarning state after the Current CSAV value declines below $+2$. Thus, false warnings of impending complete battery discharge and premature computer shutdowns are prevented.

False warnings and premature shutdowns are also prevented during Startup Voltage Depression-Section 1 because the large negative voltage-discharge slopes during the initial period of Section 1 are overwhelmed numerically and thus masked by a startup compensation factor (SCF) of $+20$. Voltage discharge slopes of over $-20$ are required to start generating positive Current CSAV's during this initial period rather than the typical values of $-4$ normally encountered.

As the negative voltage-discharge slopes decline normally in value as battery discharge progresses timewise through the voltage depression of Section 1, the startup compensation factor (SCF) of $+20$ is periodically reduced by 25 percent of its then current value until a fixed compensation factor (FCF) of $+1$ is reached. This $+1$ value is approximately equal to the voltage discharge slope values which appear during the terminal portion of Section 1 of the discharge curve and throughout Stable Section 2 of the discharge curve and the initial portions of Knee Section 3.

This fixed compensation factor (FCF) of $+1$ and the coinciding voltage-discharge slopes (SS) of between approximately $-1$ and zero prevent the CSAV(s) from attaining the $+2$ values required to start the warning counter so as to possibly start the warning and shutdown sequence.

DESCRIPTION OF THE DRAWINGS

In order that all of the structural and method features for attaining the objects of this invention may be readily understood, reference is made to the accompanying drawings wherein.

Pertinent Characteristics of the Nickel-Cadmium Cell

Before describing the structure and process of the preferred embodiment of the invention, a brief description of certain pertinent charge and discharge characteristics of the nickel-cadmium cell is set forth. This explanation will facilitate in understanding the invention.

The nickel-cadmium cell is used to store electrical energy, and its basic function is to make that energy available during discharge. The electrical discharge performance characteristics of a cell performing this work are voltage and capacity (the integral of current multiplied by time). The values of these two discharge parameters are functions of a number of application-related factors and this dependence is briefly described in this specification. A more detailed study of nickel-cadmium battery characteristics appear in "Nickel-Cadmium Battery" (Third Ed: 1986) published by the General Electric Company.

Figure 1:
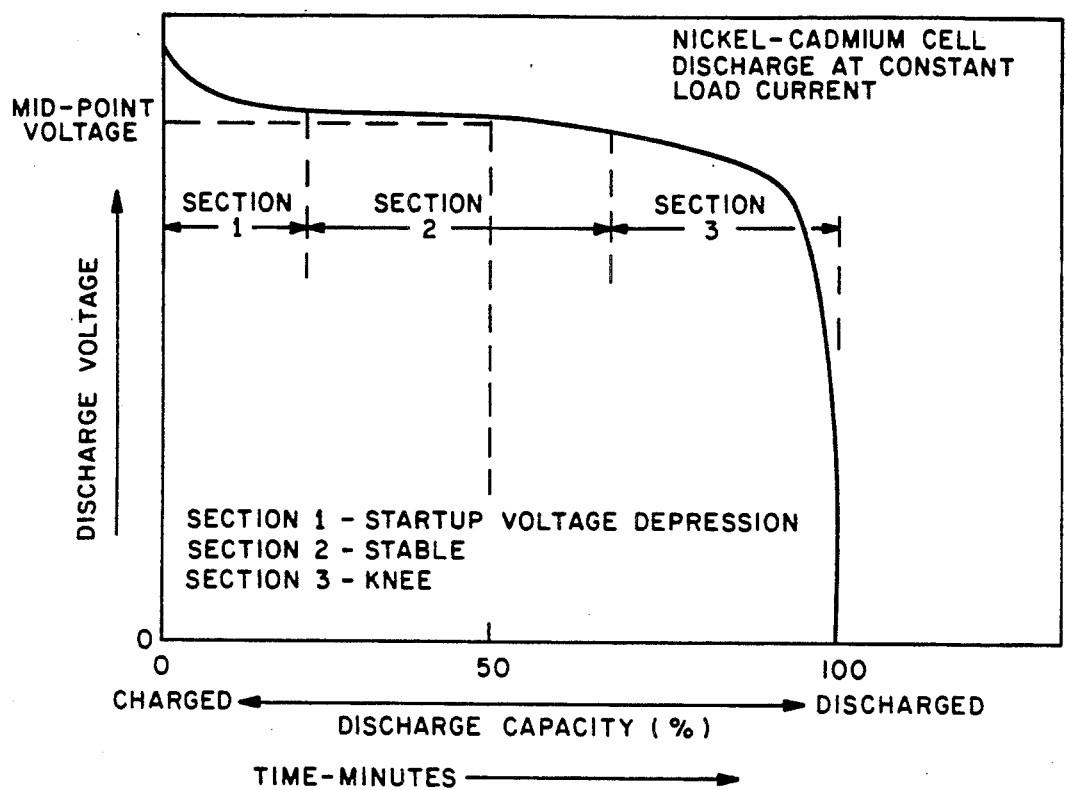
FIG. 1 shows the general shape of an ideal discharge curve of a constantly-loaded nickel-cadmium cell (or a battery of such cells) in which voltage is plotted as a function of capacity (or time)

The general shape of the discharge curve voltage as a function of capacity (or time), is shown in FIG. 1. As noted in this Figure, after an initial Startup-Voltage Depression Section 1 the discharge voltage of the nickel-cadmium cell typically remains relatively constant during a Stable Section 2 until most of its capacity is discharged, and then drops off rather sharply during a Knee-Section 3. This curve, when adjusted by considering the effects of all the application variables, provides a complete description of the functional performance of a battery.

Cell Discharge to Polarity Reversal

A principal object of this invention is to prevent cell discharge to the point of polarity reversal (FIG. 2) because of the adverse effects of polarity reversal upon battery life.

Figure 2:
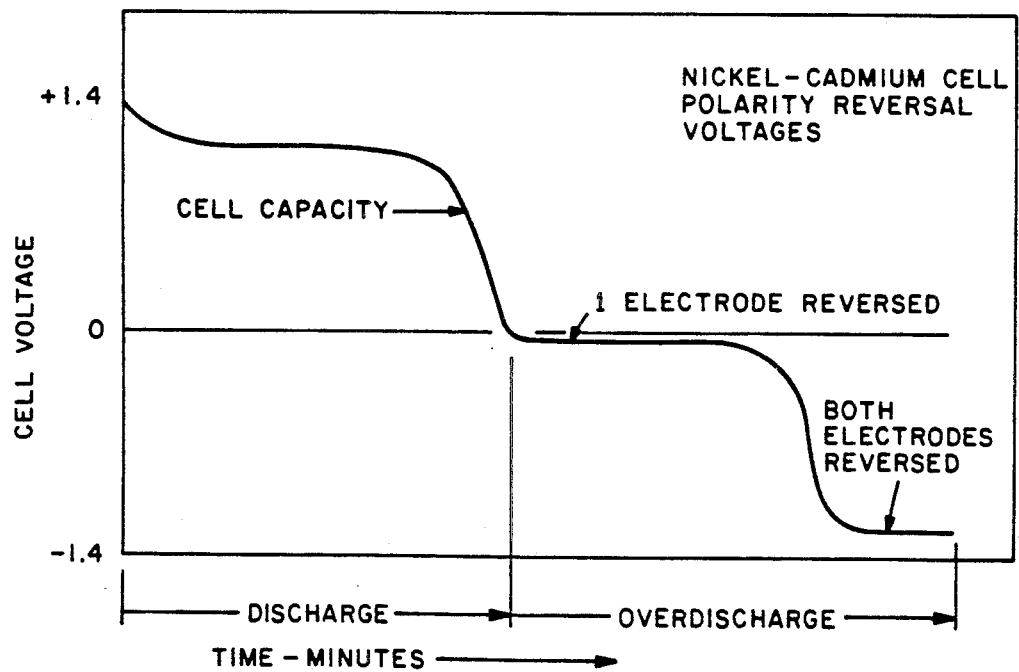
FIG. 2 shows the general shape of the discharge curve of a single nickel-cadmium cell which has undergone polarity reversal due to excessive discharge.

Although it may be convenient to think of multicell battery voltage in terms of mean voltage for each cell, the mathematics of the cell polarity reversal phenomenon illustrated in FIG. 2 result in a fundamental difference from this convenient and simple relationship.

When a multicell battery is discharged completely, even small differences in the actual capacity of individual cells inherently cause one cell to reach complete discharge sooner than the rest. It is the actual capacity of this lowest capacity cell, the minimum capacity cell of the battery, which thus determines the actual battery capacity.

Continuation of the discharge after this lowest capacity cell has reached zero volts will cause reversal of the terminal voltage of that cell, because the cells of the battery are connected in series. As the cell polarity is reversed beyond a negative 0.2 volts it begins to generate gas internally. Generally, in a sealed nickel-cadmium cell the electrode which is reversed first will be the nickel electrode, in which case hydrogen will be generated. The sealed nickel-cadmium cell is capable of only very slow dissipation of hydrogen gas. It also has a very limited amount of gas storage volume. Thus, frequent and/or extensive reversal will lead to elevated cell pressure sufficient to open a resealable safety vent. This is the reason for avoiding or minimizing application conditions which lead to repetitive or extensive cell reversal. Such applications may lead to venting which, if repeated and/or extensive, will eventually degrade the performance of the sealed cell.

The general shape of the cell voltage curve during discharge into polarity reversal is shown in FIG. 2. The magnitude of the negative voltage appearing on the polarity reversed cell is dependent on the discharge rate as well as cell design and manufacturing process parameters.

Many nickel-cadmium cells are designed and manufactured to resist adverse effects of cell reversal caused by the deep discharging of a multi-cell battery. Batteries of low cell count that are fully charged between cycles normally possess insufficient capacity differences to generate any significant permanent damage resulting from extending the discharge of the battery to a low end-of-discharge voltage.

The important point, relative to the detrimental effects of cell reversal, is that these are cumulative effects. They are dependent on both the depth (Ah) in reverse and the frequency of cell reversal. The depth of reversal is in turn dependent on the end-of-discharge voltage (EODV) and the actual capacity differences between the cells in the battery. The long-range detrimental effects on voltage and capacity performance increase with both these factors.

The detrimental effects of reversal are the least when the rates of discharge during the reversal ar the highest. This apparent paradox results from the fact that cells which experience terminal voltage reversal during high rate discharge still have significant amounts of charge remaining in the electrodes.

Voltage Depression Due to Cell Overcharge

Figure 3:
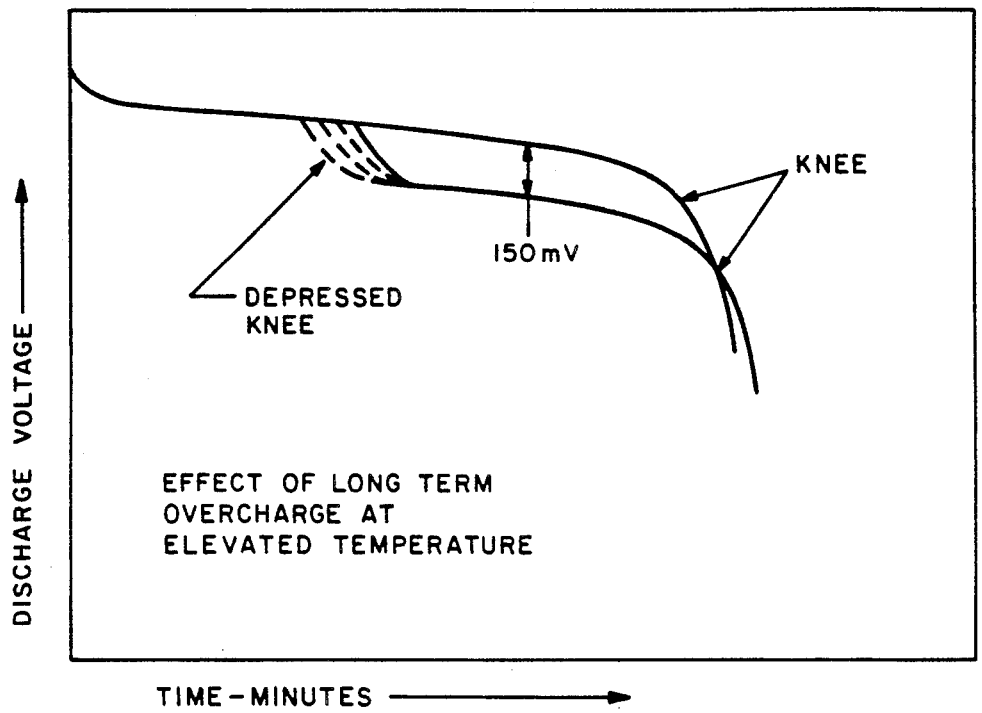
FIG. 3 shows the general shape of the discharge curve of a nickel-cadmium cell (or a battery of such cells) which has been subjected to long-term overcharge at elevated temperatures.
Figure 5:
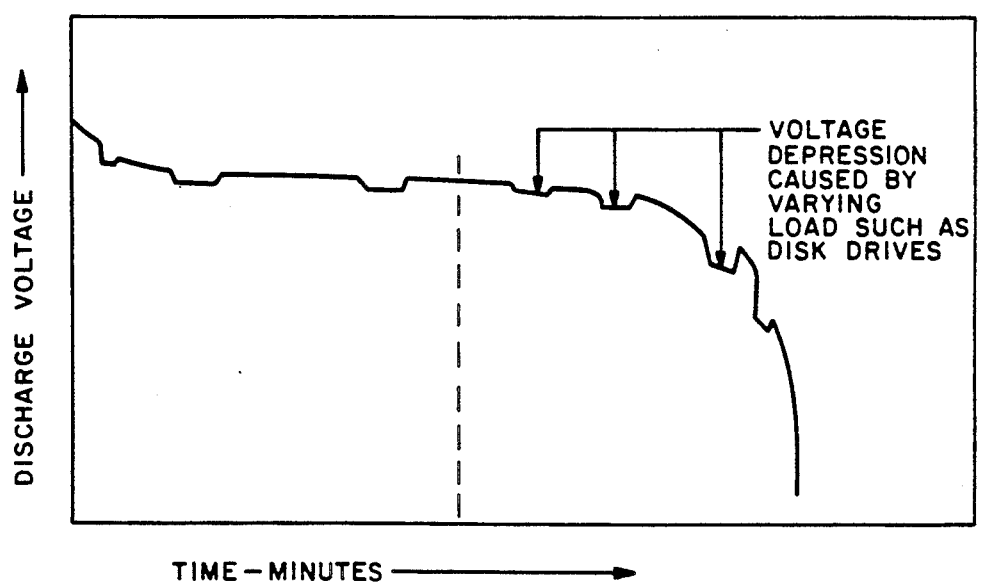
FIG. 5 shows the general shape of the discharge curve of a nickel-cadmium cell (or a battery of such cells) which has been subjected to increased momentary loading, for example, caused by the connection of a disk drive.

Cells exposed to overcharge for very extended periods of time, particularly at elevated cell temperatures, may develop an additional shortcoming called voltage depression (FIG. 3). This phenomenon is one in which the cell voltage is depressed approximately 150 mV below the normally expected values. This depression affects the cell output voltage and is independent of discharge rate.

This depression effect initially appears on the discharge voltage curve near the end of discharge. With extension of the overcharge time (non-discharge) of the cell, this depression progresses slowly toward the midpoint and beyond. Accompanying this effect of depression in the voltage dimension of the curve is an actual slight increase in the capacity dimension as illustrated in FIG. 3. This depressed voltage effect is an electrically reversible condition and disappears when the cell is completely discharged and charged (sometimes called conditioning). It thus appears only on the first discharge following a very extended overcharge. It will reappear if the extended overcharge is repeated.

The phenomenon which causes this depressed voltage is continuous overcharging of the active material of the electrode. The effect is erased by discharging and recharging that portion of the active material which has experienced the extensive overcharge. For this reason the depressed voltage effect in the discharged portion of the curve is erased by the very act of observing it, when the discharge is carried beyond the first knee of the depressed curve. Complete discharge, and subsequent full charge, essentially restores the curve to its normal form.

The reversibility of this effect is probably the very characteristic that gives rise to the misnomer Memory. When cells are subjected to continuous charge/overcharge, with only modest discharges (repetitive or otherwise), the reversibility of the effect actually prevents the voltage depression from occurring in that portion of the electrode active material which is cycled. The voltage depression phenomenon is, however, not erased from that portion of the electrode material which has been subjected to continuous overcharge but NOT discharged. In this situation, whenever the cell is discharged deeper than recent previous discharges and reaches the beginning of the previously uncycled material, the voltage may decrease 150 mV per cell. This misleads the observer into believing that the discharge is at the knee of the normal discharge curve and erroneously concluding that the cell remembers and, thus, delivers only the amount of capacity previously repetitively used. Instead, the phenomenon is actually related only to extended overcharging and incomplete discharging, not repetitive shallow cycling. This is because that portion of the electrode material which has experienced overcharge and not been discharged for an extended period of time slowly shifts to a more inaccessible form.

The depressed voltage effect can of course cause loss of useful capacity in those application cases where a high cutoff voltage prevents complete discharge of the minimum capacity cell in the battery. If voltage depression has occurred, complete discharge requires continuation down through the depressed knee to that voltage level which keeps all the electrode material active. An end-of-discharge voltage (EODV) on the minimum cell of, for example, 75 percent of its MPV or less will accomplish that restoration with each discharge.

THE STRUCTURE OF THE PREFERRED EMBODIMENT

Figure 4:
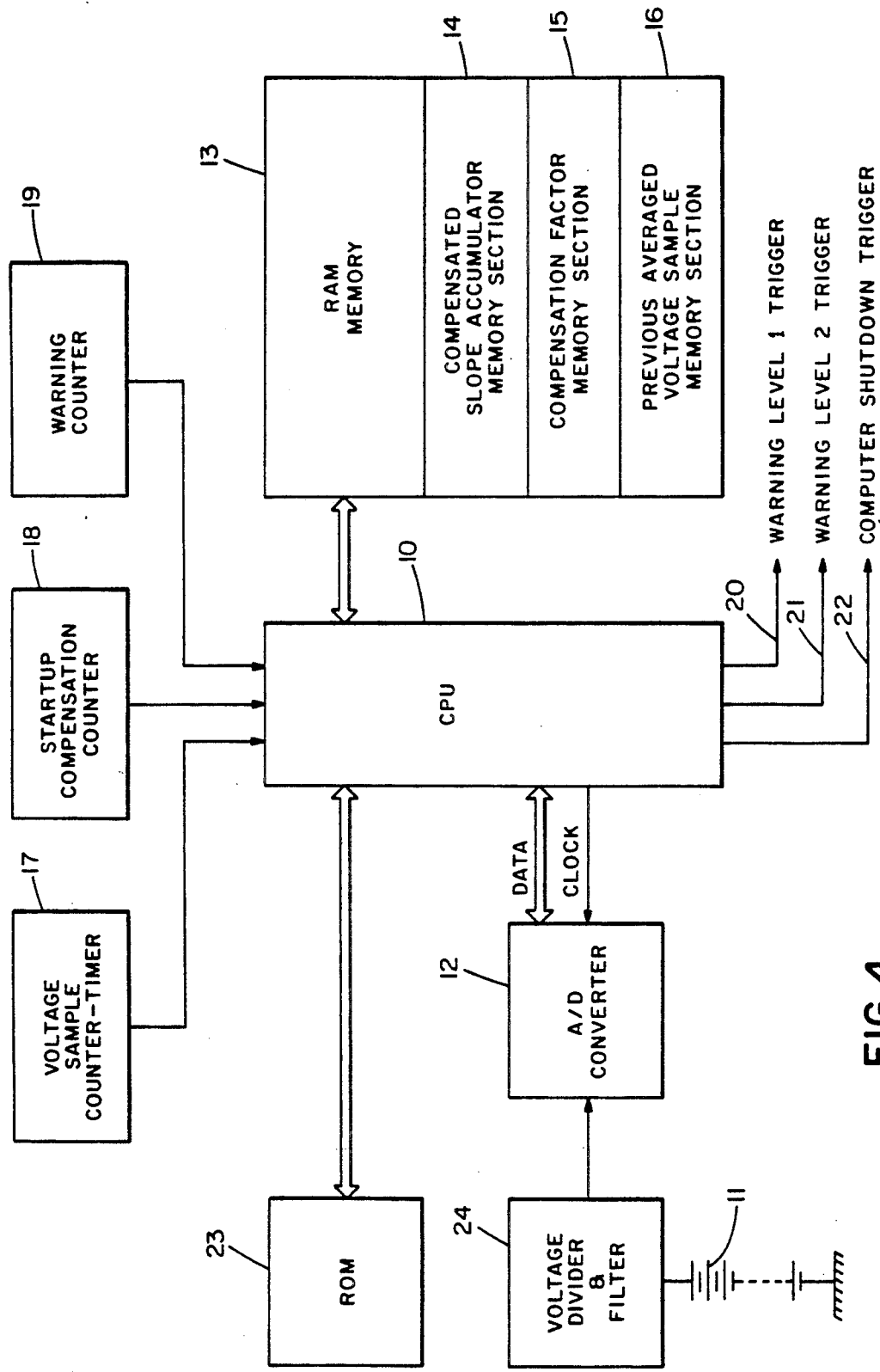
FIG. 4 is a block diagram of a preferred embodiment of the battery discharge management circuitry of this invention.

A simplified block diagram of a preferred embodiment of the battery-discharge monitoring and warning circuitry of this invention, as applied to a laptop computer, is shown in FIG. 4.

Some Basic Definitions

The following set of definitions will facilitate an understanding of the mode of operation of the circuitry of FIG. 4:

VOLTAGE SAMPLE (VS)—is the instantaneous peak amplitude of the voltage pulse appearing at the output of the analog-to-digital converter (A/D) 12.

AVERAGED VOLTAGE SAMPLE (AVS)—is the average voltage of a series of 256 consecutive voltage samples, which is also expressed mathematically as: $AVS = (VS1 + VS2 + VS3 + \ldots VS256)/256$.

PREVIOUS AVERAGED VOLTAGE SAMPLE (PAVS)—is the averaged voltage sample taken one AVS time period prior to a realtime AVS.

SLOPE SAMPLE (SS)—is a value proportional to the slope of the battery discharge curve where the slope is that of a straight line drawn through two consecutive AVS(s) values; and which relationship is expressed mathematically as $SS = (AVS\ 'Y' - AVS\ 'X')/$Time Period of an AVS.

NOTE: 'X' and 'Y' are two consecutive AVS(s) with 'X' being the PAVS and thus the first AVS in time. And as the time period of the Voltage-Sample Counter-Timer 17 is the Time Period of an AVS and is always constant throughout battery discharge, this time period can be eliminated from all calculations with the varying SS(s) being proportionally correct. A declining discharge curve has a negative slope, and an ascending discharge curve will have a positive slope.

COMPENSATION FACTOR (CF)—is a term used in determining the Compensated Slope Accumulator Value (CSAV) and it is represented by a dynamic value. The CF is adjusted throughout the Startup Voltage Depression-Section 1 of the battery discharge curve, from an initial or startup 20 CF, to a 1 CF. During Stable Section 2 and Knee Section 3, CF remains a constant 1 value. The above CF values are arbitrary values employed in this detailed description to facilitate understanding of the invention.

STARTUP COMPENSATION FACTOR (SCF)—is the CF value at startup, or 20.

FIXED COMPENSATION FACTOR (FCF)—is the constant CF value (+1) during part of Sections 1 and all of Sections 2 and 3 of the discharge curve.

COMPENSATED SLOPE ACCUMULATOR VALUE (CSAV)—is an end-result value located in RAM 13 which is the result of processing in accordance with the equation:

Current CSAV = Previous Adjusted CSAV ± |New SS| − CF.

Current CSAV is a value of fundamental importance to the battery power management process as it enables the circuitry to render warning alarms and computer shutdown only in response to a battery discharge in Knee Section 3 of the normal battery discharge curve, or in response to a very large negative slope in the terminal knee portion of partially charged battery discharge curve.

NOTE 1: In the equation for CSAV, if the new SS is a negative slope, then the absolute value of New SS is added in the equation. However, if the new SS is a positive slope, then the absolute of New SS is subtracted in the equation.

NOTE 2: Previous CSAV and the New SS (New SS is the current SS) are values determined timewise at a time separation of two consecutive SS(s), which is 256 times the time period of the voltage-sample counter-timer (i.e. ≈30 seconds). The CF value is that determined at the same time the New SS is calculated. Thus Current CSAV, New SS and CF are real-time values.

NOTE 3: The Previous CSAV is adjusted to zero if its value is less than zero. Accordingly, only a positive Previous CSAV contributes to the numerical value of a Current CSAV. The equation for Current CSAV may also be written and simplified as follows: Current CSAV = Previous Adjusted CSAV − New SS − CF.

STARTUP COMPENSATED SLOPE ACCUMULATOR VALUE (SCSAV)—is the CSAV at powerup of the computer, and is set to 0.

Simplified Circuit Explanation

A simplified block diagram of a preferred embodiment of the battery-discharge monitoring and warning circuitry of this invention, as applied to a laptop computer, is shown in FIG. 4.

The principal components of the circuitry and their generalized functions are as follows:

Central processing unit (CPU) 10 and its associated circuitry monitor the discharge curve of battery power supply 11, and CPU 10 may also perform the usual CPU functions.

Battery 11 comprises a plurality of nickel-cadmium cells which serve as a power supply for the laptop computer.

Analog-to-digital converter (A/D) 12 converts the analog output voltage of battery 11 into a series of digital pulses which are ultimately sampled at a repetition period of ≃0.11 seconds and which establish VS values.

The VS values are averaged by CPU 10 in a group of 256 VS pulses to obtain a series of AVS values having a repetition period of 30 seconds. These AVS pulses are processed to determine SS values in accordance with the equation SS=AVS 'Y'−AVS 'X'.

RAM 13 contains memory sections 14, 15 and 16 which are peculiar to this invention.

Compensated slope accumulator memory section 14 is a dedicated memory section located within RAM 13 which contains the values which comprise the Previous CSAV as adjusted, the New SS used in determining the Current CSAV, and the Current CSAV.

Compensation factor (CF) memory section 15 is a dedicated memory section located within RAM 13, which contains the dynamic CF values (that is, CF as adjusted during battery discharge, and fixed (FCF) ) used in determining the Current CSAV;

Previous averaged voltage sample memory section 16 is a dedicated memory section located within RAM 13 which contains the PAVS value used in determining a SS value.

Voltage sample counter-timer 17 is a timer preset to the repetition sampling period of 0.11 seconds for the voltage pulses appearing at the output of A/D 12 so that VS measurements can be made every 0.11 seconds by CPU 10. As previously noted, these VS values are used to determine AVS values, and then using two consecutive AVS values to calculate a SS value.

Startup compensation counter 18 is a timer preset to a time period which is approximately equal to 1/16 of the time over which startup voltage depression (Section 1 of the discharge curve) occurs for the particular cells of battery 11 when fully charged. This time period is determined from the manufacturer's specifications and battery discharge curve for those cells and is used in the decrementing process of adjusting CF. Startup compensation counter 18 is restarted every fourth SS until CF equals 1.

Warning counter 19 is a timer preset to a time period over which an overcharge voltage depression (Section 2 of the discharge curve) may occur in battery 11 because of an overcharge condition or memory effect. In a typical battery powered computer this time period may be ≃6 SS repetition periods. Warning counter 19 also establishes the operate times for Warning Level 1, Warning Level 2, and Computer Shutdown occurring during Knee Section 3 of the battery-discharge curve.

Warning Level 1 (WL-1) trigger line 20 goes high to activate an alarm when the output voltage of battery 11 is reduced through discharge to a Level 1 preliminary warning point representing the approximate start of Knee Section 3 of the battery discharge curve. The warning operating point of Level 1 is a preset value WL-1 specified by the statement:

WL-1≃(absolute value of the average of all SS(s) over the initial 36% of Knee Section 3).

WL-1 ≃2 in the preferred embodiment of this invention shown in the drawings.

Warning Level 2 (WL-2) trigger line 21 goes high to activate a second alarm, which warns that computer shutdown is imminent, when the output voltage of battery 11 is further reduced through discharge to a Level 2 final warning point representing substantial entry into the rapidly-declining knee of Knee-Section 3 of the battery discharge curve. The warning operating point of Level 2 is a preset value WL-2 specified by the statement:

WL-2≃(absolute value of the sum of SS(s) over the initial 81% of Knee Section 3)/2.

WL-2≃22 in the preferred embodiment of this invention shown in the drawings.

Shutdown trigger line 22 goes high at a Computer Shutdown point located on a terminal portion of the rapidly-declining knee of Knee Section 3 having a relatively large negative slope and occurring a short time interval before battery 11 would otherwise reach complete discharge. The shutdown value (SDV) is specified by the statement:

SDV≃(absolute value of the sum of the SS(s) over the last 19% of Knee Section 3).

SDV≃is approximately 56 in the preferred embodiment of the invention shown in the drawings.

Read-only-memory (ROM) 23 contains all the following preset times and values:

1. Counter times
    a) VS counter-timer 17≃(1 VS repetition period) which is ≃0.11 second.
    b) Startup compensation counter 18≃(1/16 of Section 1 of the discharge curve).
    c) Warning counter 19≃(6 SS repetition periods) which is≃180 seconds.
2. Preset values
    a) Startup compensation factor (SCF)≃(½ absolute value of the sum of SS(s) occurring during the first ¼ of the time period of Section 1 of the discharge curve); which is ≃+20 for a normal discharge curve in the preferred embodiment described.
    b) Fixed compensation factor (FCF)≃(absolute SS value at any point on Section 2 of the discharge ×4; which is≃1 for the preferred embodiment described.
    c) Startup compensated slope accumulator value (SCSAV) is 0 for the preferred embodiment described.
    d) Warning Level 1 (WL-1)≃(absolute value of the average of SS(s) over the initial 36% of Knee Section 3 of a normal discharge curve); which is approximately +2 for the preferred embodiment described.
    e) Warning Level 2 (WL-2)≃(absolute value of the sum of SS(s) over 81% of Knee Section 3)/2; which is approximately +22 for the preferred embodiment described.
    f) Shutdown Value (SDV)≃(absolute value of the sum of the SS(s) over the last 19% of Knee Section 3); which is approximately +56 for the preferred embodiment described.

Voltage-divider and filter 24 reduces and filters the direct-current output voltage of battery 11 for suitable application to the input of A/D 12.

THE MODE OF OPERATION OF THE PREFERRED EMBODIMENT

The operation of the battery power management circuitry of this invention shown in FIG. 4 is now described with reference to the composite flow chart of FIG. 7 (FIGS. 7a–d) and the composite battery-discharge curve of FIG. 6 (FIGS. 6a–d) (including also the alternate curve for overcharge voltage depression (FIG. 6c), the alternate insert curve for a partially charged battery (FIG. 6b), and the fragmentary discharge curve of FIG. 6d which shows the change in the discharge curve caused by a momentary increase in load).

In order to understand fully the operation of the circuitry, the detailed description is divided into the following four principal operational modes of battery discharge monitoring and management:

1) operation during discharge of a fully charged battery;
2) operation during discharge of a partially charged battery; and
3) operation during a momentarily applied increase in load.
4) operation during discharge of a battery subject to overcharge voltage depression;

The following is a summary of the alphabetic letter references used throughout the following operational description:
VS voltage sample
AVS averaged voltage sample
PAVS previous averaged voltage sample
SS slope sample
CF compensation factor
SCF startup compensation factor
FCF fixed compensation factor
CSAV compensated slope accumulator value
SCSAV startup compensated slope accumulator value
WL-1 warning level 1
WL-2 warning level 2
SDV computer shutdown value The Mode of Operation During Discharge of a Fully Charged Battery Referring now to the flow chart of composite FIG. 7, the various preset times and values are set forth in blocks A and B. The states of the circuitry of FIG. 4, are set forth in blocks C through Z, and AA through AF.

The counter values set forth in block A are factory preset in ROM 23 so as to provide proper circuit operation for the particular nickel-cadmium cells used in battery 11. In particular, voltage sample counter-timer 17 is set to the time period to take 1 VS, or approximately 0.11 seconds; startup compensation counter 18 is set to approximately 1/16 of the time period of the Startup Voltage Depression-Section 1 of the discharge curve, or approximately 90 seconds; and warning counter 19 is set to a time period approximately or equal to 6 SS(s) times or approximately 180 seconds.

The values set forth in block B are also factory preset in ROM 23. In particular, SCF is approximately or equal to +20 for a normal discharge curve; SCSAV equals 0; FCF is approximately or equal to +1; WL-1 is approximately or equal to +2; WL-2 is approximately or equal to +22; SDV is approximately or equal to +56.

At computer power-up, CPU 10 sets all values in RAM 13 to zero.

In state C, CPU 10 takes its initial VS from battery 11. Since CPU 10 has to take 256 VS(s) (to filter voltage noise) to get a single AVS, the following sequence of operations are performed by CPU 10 to get a single AVS:

In state D, a check is made by CPU 10 to determine if 256 VS(s) have been taken.

If not, state E is entered wherein voltage sample counter-timer 17 is started and control is then passed to state F.

In state F, CPU 10 is made to wait by voltage sample counter-timer 17 for the period specified in counter-timer 17 (i.e. ≈0.11 seconds). At the end of this period, control is passed back to state C to get the next VS.

States C, D, E and F are successively repeated by CPU 10 until the 256 VS(s) are taken by CPU 10. Having obtained 256 VS(s), CPU 10 then calculates in state G an AVS in accordance with the AVS formula set forth in the "Some Basic Definitions Section". The time period for CPU 10 to calculate each AVS is approximately 30 seconds (0.11 second ×256). The first AVS is calculated 30 seconds after computer powerup.

If the AVS thus calculated is determined in state H not to be the first AVS calculated by CPU 10, then control is passed to state J. However, if the AVS is the first AVS calculated by CPU 10, and since CPU 10 has no PAVS from which to calculate the slope (SS), state I is entered. In state I, CPU 10 sets the PAVS in RAM section 16 to the first calculated AVS value. Control is then passed back to state C so that CPU 10 can calculate the next (the second) AVS.

Having calculated two successive AVS(s), CPU 10 in state J then calculates a single SS in accordance with the SS formula set forth in the "Some Basic Definitions Section". The first SS is calculated 60 seconds after computer powerup and has a value of −4.

In state K, CPU 10 determines if the SS calculated in state J is positive or negative, and upon which determination control is passed either to state L (+) or to state M (−). In state L or M, a preliminary arithmetic calculation for the quantity (Previous Adjusted CSAV±|New SS|) is made which is ultimately used to determine the Current CSAV (see the first two terms in the equation for Current CSAV appearing in the Some Basic Definitions Section). If SS is positive, then in state L CPU 10 subtracts the absolute value of SS from the Previous CSAV, which value is located in RAM section 14. If SS is negative, then in state M, CPU 10 adds the absolute value of SS to the Previous CSAV. The −4 SS produces a +4 value at state M. Control is then passed from either L or M to N.

A positive SS generally occurs only when computer load is removed from battery 11. A negative SS occurs during discharge of both a fully and partially charged battery, overcharge voltage depression, cell dropout, and application of an increased load.

In state N, CPU 10 provides compensation for the voltage depression caused by either the startup conditions (Startup Voltage Depression-Section 1), the overcharge battery condition appearing in broken line in Stable Section 2 of the discharge curve, cell dropout, or a momentarily applied heavier-load condition. This compensation is accomplished by subtracting the CF value appearing in RAM section 15 from the adjusted quantity (Previous adjusted CSAV±|New SS|) obtained from state L or M to obtain Current CSAV. At 60 seconds computer operate time, Current CSAV is −16 obtained by subtracting +20 CF value from +4.

In state 0, CPU 10 determines if the Current CSAV obtained from state N is either positive or negative. If the Current CSAV is positive then control is passed directly to state V. If the Current CSAV is negative, then this Current CSAV is set to zero by CPU 10 in state P before passing control over to state Q. The Current CSAV obtained from state N will be negative or equal to 0 if the startup voltage depression is in progress.

In state Q, CPU 10 examines the CF value to determine if Startup Voltage Depression-Section 1 is in progress. If the CF is greater than FCF (FCF is +1) then the startup voltage depression is in progress and control is then passed to state R; otherwise if less than FCF, control is passed back to state C.

In state R, CPU 10 determines if the startup compensation counter 18 is currently on—if so it passes control to state T; otherwise it starts or restarts startup compensation counter 18 in state S and then passes control to state C. Startup compensation counter 18 is started 60 seconds after computer powerup when the first SS is calculated in state J.

In state T, a check is made by CPU 10 to verify if the time preset (90 seconds) in startup compensation counter 18 has elapsed. If it has not elapsed, then control is passed to state C; otherwise the CF value is reduced by 25% of its current value in state U before passing the control back to state C. Startup compensation counter 18 provides a mechanism for masking the startup voltage depression of Section 1 caused by the application of the computer load at powerup. The time duration of 90 seconds is chosen empirically so that the CF can be decremented from its high initial value of +20 at the end of each counter 18 start and restart period by 25% of its previous value until CF attains a +1 value. This +1 value is closely approximate the transition slope of the discharge curve at the end of Section 1 and the entire portion of Section 2. Accordingly, the high initial SCF and the decremented values of CF prevent the Current CSAV from attaining the values required to produce warning levels and also computer shutdown when a normal battery discharge curve is monitored.

In state V, the startup compensation counter 18 is stopped (if previously set running during the process of reducing CF in states Q, R, S, T, U).

During a normal battery discharge process, state V is entered by CPU 10 if the Startup Voltage Depression-Section 1 has passed; otherwise, the CF is repeatedly adjusted in states Q, R, S, T, U during each startup compensation counter 18 time period until it reaches a FCF value of +1 at 16 ½ minutes after computer powerup.

From state V onwards the task of CPU 10 is principally to accurately identify Knee Section 3 of the discharge curve by detecting increasing positive values of Current CSAV (with a threshold value of at least +2) both at the beginning and at end of the 180 second time period of the warning counter 19. To achieve this objective, the following sequence of operations are performed by CPU 10.

In state W, the Current CSAV obtained from state N is examined to determine if its value has reached the WL-1 value of +2. If so, state Y is entered; otherwise it implies to the CPU that the battery discharge is still in Stable Section 2.

If the discharge is in Stable Section 2, control is passed back to state C after assuring that warning counter 18 is stopped in state X. Also before passing control over to state C, the current AVS which was obtained from state G is saved as the PAVS in RAM section 16 and is shown in state I.

The above-mentioned process is successively repeated until the discharge reaches Knee Section 3. The circuitry preliminarily determines that Knee Section 3 has been reached by detecting a Current CSAV of +2 or more in state W and then confirmation is made at end of the warning counter period of 180 seconds if the then Current CSAV is +2 or more. The then Current CSAV at the end of the warning counter period must be between +2 and less than +22 to trigger WL-1 in state AC, or between +22 and less than +56 to trigger WL-2 in state AE skipping WL-1, or +56 or more to effect computer shutdown in state AF.

Thus, in state Y, to assure that Knee Section 3 of the discharge curve is not falsely seen by CPU 10 due to a momentarily applied load, CPU 10 waits for a time period of warning counter 18 before triggering WL-1 to the user by passing control to state AB.

In state AB, a check is made by CPU 10 to determine if the Current CSAV value is at or above WL-2 (or +22). If not WL-1 is triggered as in state AC; otherwise, control is passed to state AD.

In state AD, a check is performed by CPU 10 to determine whether the Current CSAV value has reached the SDV. If so, the system is shutdown in state AF; otherwise WL-2 is triggered in state AE indicating imminent shutdown and control is passed to C.

If control is passed to C, this implies to the CPU that usually a few additional minutes of computer user time remains after WL-2 is triggered; and the system carries on to collect the next SS to be processed to effect computer shutdown when and if the SDV of +56 is calculated as a Current CSAV.

The Mode of Operation During Discharge of a Partially Charged Battery

The sequence of operations performed during the discharge of a partially charged battery is identical to those described with reference to the section entitled "The Mode of Operation During Discharge of a Fully Charged Battery", with the following three exceptions:
1) Depending upon the charged level of the battery, the CF value may or may not go through all the iterations of CF reduction in the states P, Q, R, S, T, U, until the FCF ($\simeq$1) is reached. This occurs because the Current CSAV remains positive in state 0 because of the much higher slopes (SS) than in a case of a fully charged battery.
2) Again depending upon the charged level of the battery, the stable section discharge may or may not exist. If there is a stable section, then the flow chart states C, . . . V, W, X are repetitively executed until a knee section is detected.
3) Once again depending upon the charged level of the battery the knee section of the discharge curve may be shorter than for a fully charged battery in which case the number of iterations performed by states C, . . . ., V, W, Y, AA, . . . . AD, AE may be fewer than in the case of a fully charged battery, thereby yielding shorter warning periods.

In the example of a partially charged battery discharge curve shown in the drawings, the states C, D, . . . ., 0, P, Q, R, S, T, U are executed only once as the Current CSAV, turns positive after the first iteration. As seen this discharge curve has no stable section of discharge. Immediately following a short startup voltage depression, the discharge merges into the knee section of the discharge.

In state W, the CPU detects this entry into the knee section by detecting a positive value in the Current CSAV which trips the warning counter in section Z. Very shortly afterwards WL-1 is activated in state AC and again shortly thereafter WL-2 is activated in state AE. After a very brief duration the Current CSAV reaches the SDV value and the system is shutdown in AF.

Figure 6B:
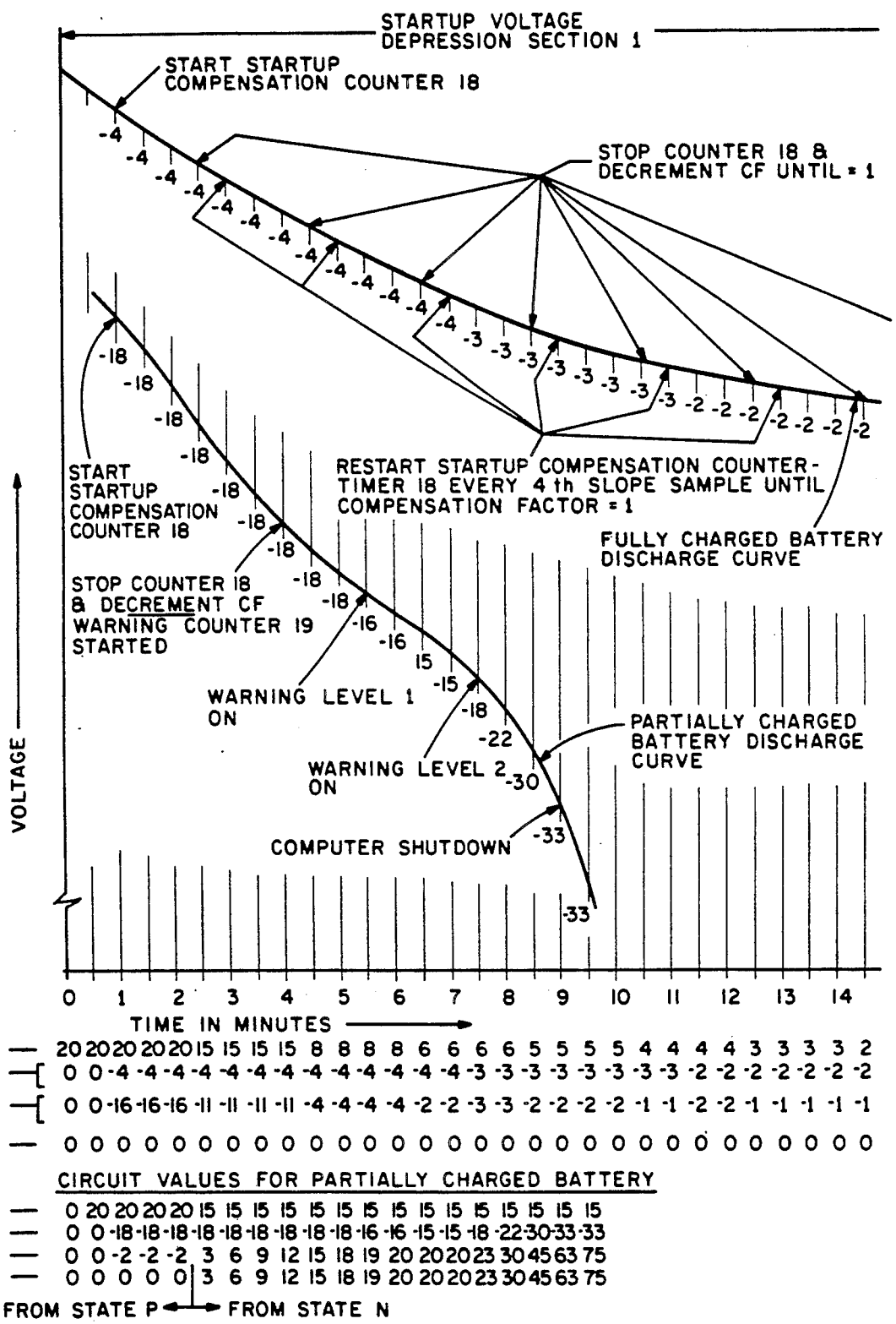
FIG. 6 is a diagram of assistance which shows the manner of assembly of FIG. 6a through FIG. 6d to form the composite discharge curves of FIG. 6.
Figures 7, 7A:
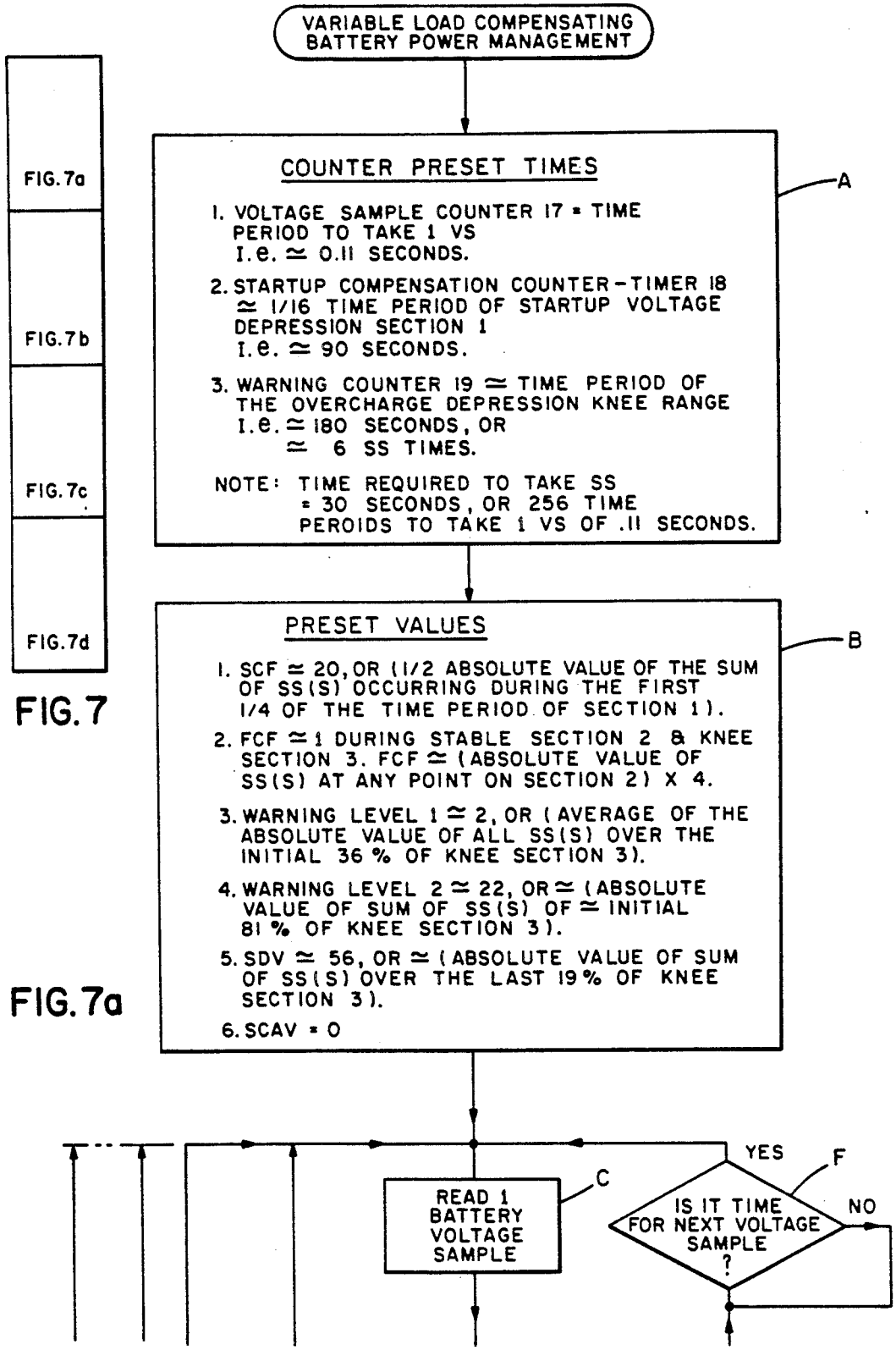
FIG. 7 is a diagram of assistance which shows the manner of assembly of FIG. 7a through FIG. 7d to form a flow chart of the invention.
Figure 7B:
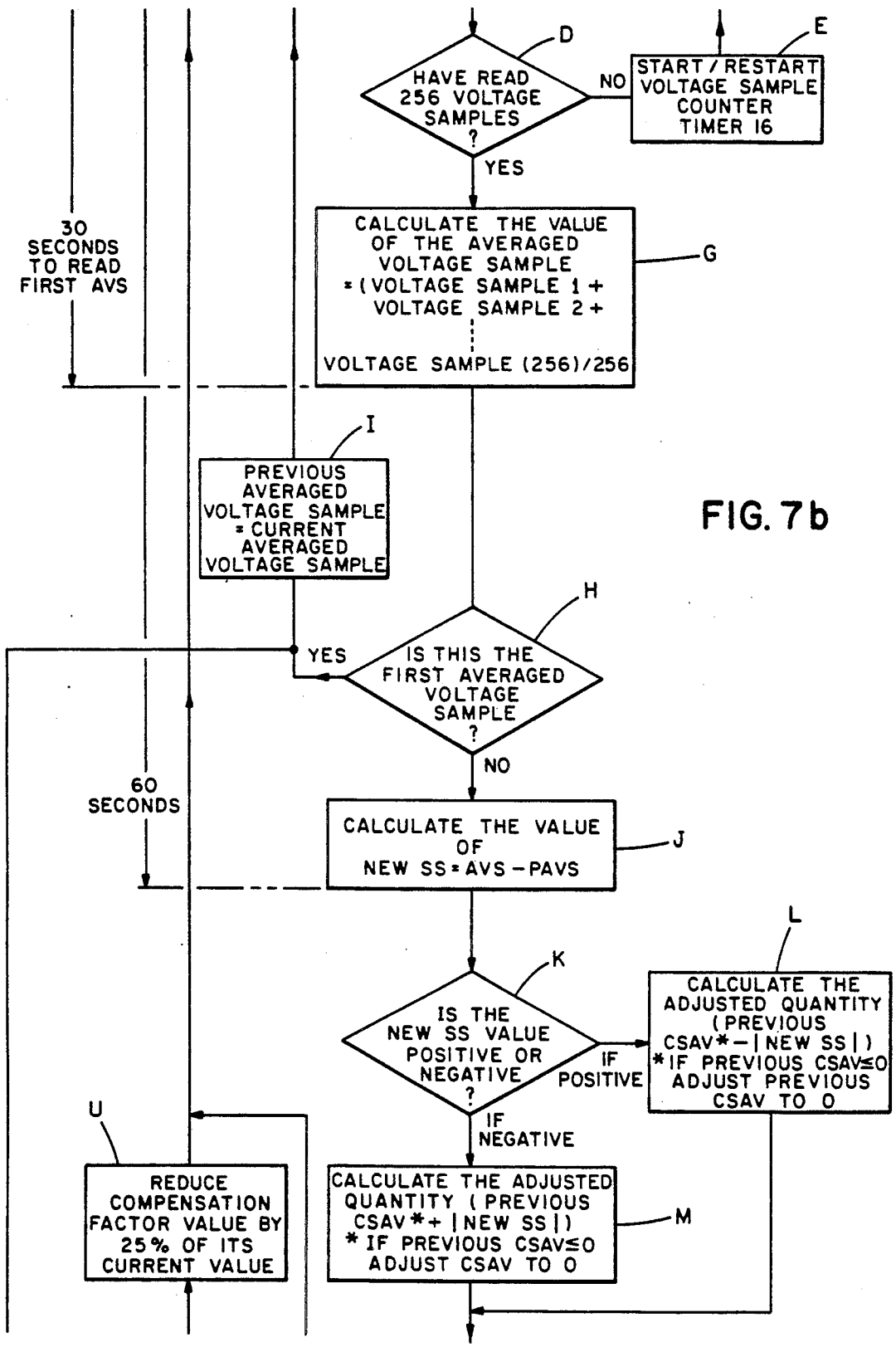
Figure 7C:
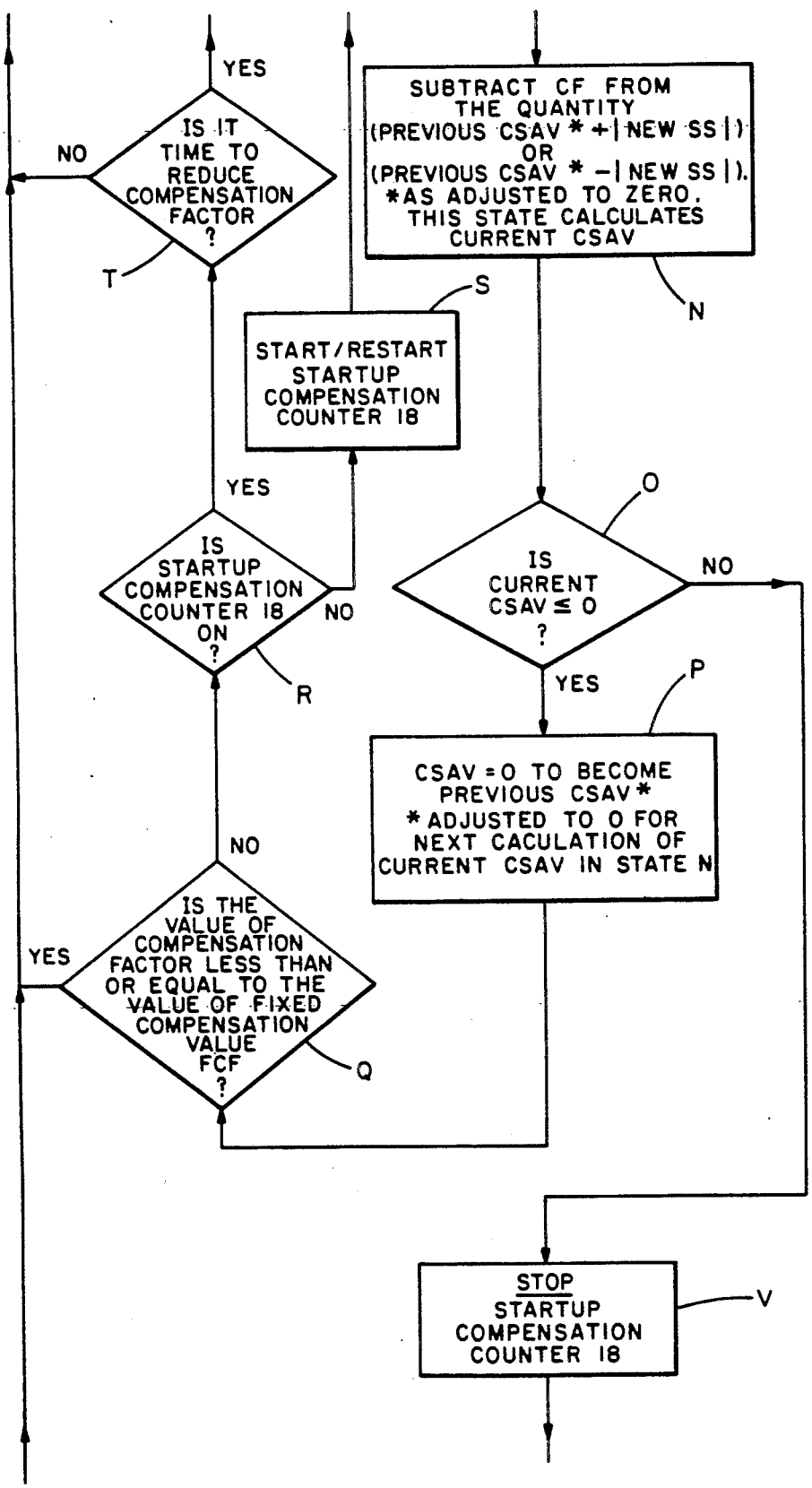
Figure 7D:
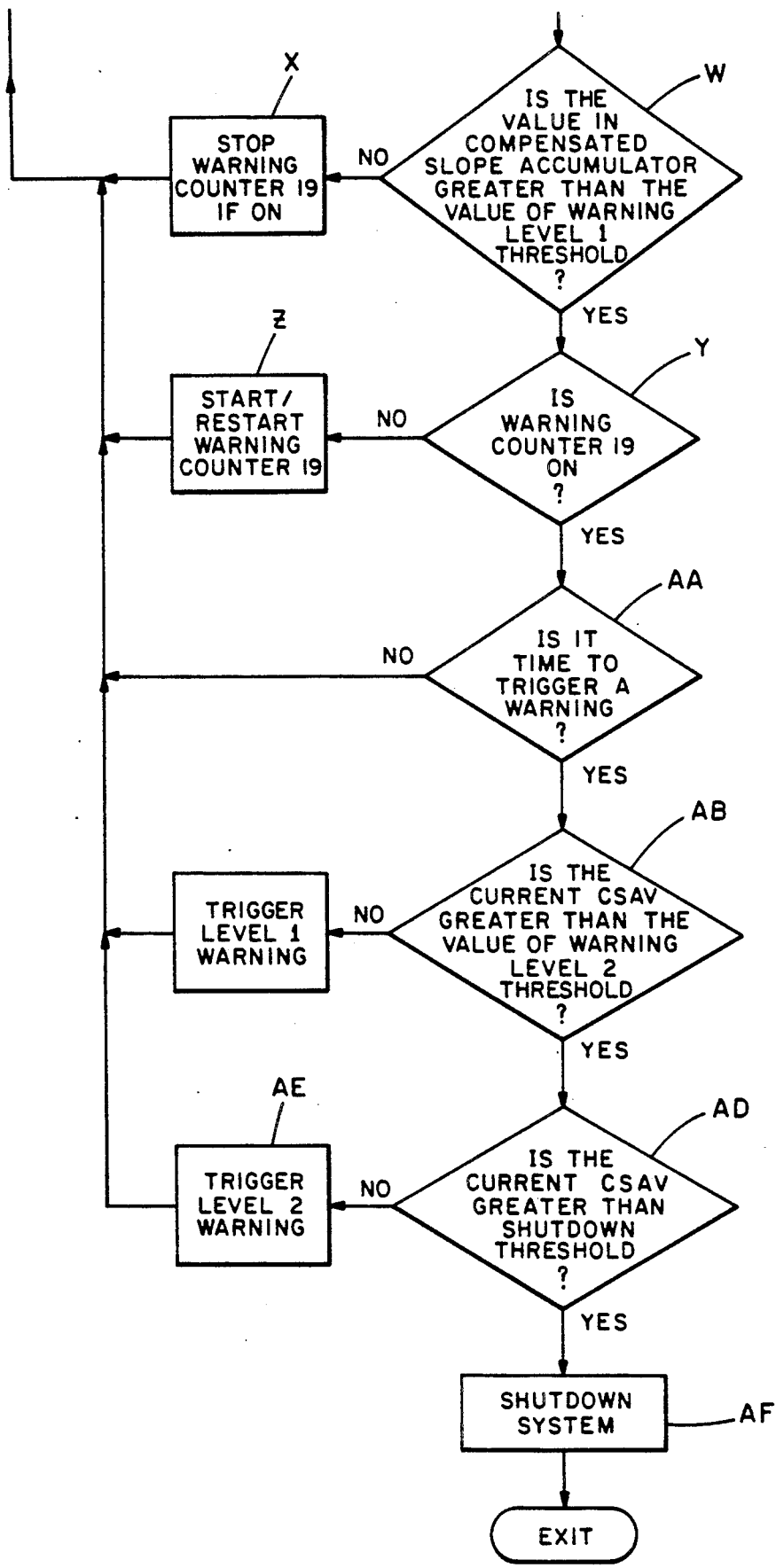

Referring to the "Circuit Values for Partially Charged Battery" shown in FIG. 6b, warning counter 19 is activated when Current CSAV reaches +3 at 150 seconds after computer powerup. (It will be recalled that warning counter 19 is started in states Y or Z whenever Current CSAV equals or exceeds a WL-1 of +2. However, a warning, either WL-1 or WL-2 is not triggered in states AC or AE, respectively, until the warning period of 6 SS times elapses (180 seconds) in order to assure that the WL-1 threshold was not caused by momentary circuit voltage variations which should be ignored.

At the end of the warning period which occurs 5 ½ minutes after computer powerup, CPU 10 detects a Current CSAV of +19. Since a CSAV of +19 is above the WL-1 threshold and below the WL-2 threshold, WL-1 is triggered in state AC.

Since the Current CSAV(s) continue to increase in positive values after the WL-1 alarm is activated, WL-2 is triggered at 7 ½ minutes after computer powerup when the Current CSAV at +23 first exceeds the WL-2 threshold of approximately +22. At 9 ½ minutes after computer powerup, a Current CSAV at +63 first exceeds the SDV threshold of approximately 56 and so the computer is shut down.

In the example shown in the drawings, both the Wl-1 and the Wl-2 alarms are activated before computer shutdown because the Current CSAV(s) pass through the WL-1, WL-2 and SDV threshold values in sequence as the discharge of a partially charged battery progresses. However, if the negative SS(s) of the discharge curve for a partially charged battery increase rapidly timewise, then WL-1, or even both WL-1 and WL-2, could be skipped with the circuitry proceeding directly to shutdown.

In particular, in cases where the battery is charged for only a brief period (for example, 5 minutes), the knee section of the discharge curve is so steep negatively, that WL-2 is turned on instead of first turning on WL-1. This occurs because the Current CSAV reached the WL-2 threshold after the warning counter period by virtue of the steep negative knee section. However, if the knee section is almost absent, as is the case where the battery is fully discharged and never charged, the circuitry will reach the SDV threshold by the end of the warning counter period.

The Mode of Operation During Momentary Increase in Load Due to Disk Access

The monitoring circuitry of this invention is able to detect and ignore positive CSAV(s) which momentarily exceed a WL-1 threshold of approximately +2, or for that matter even the larger thresholds of WL-2 and SDV. These positive CSAV(s) are usually generated by momentary increases in load caused by a computer disk access or a short lived steep negative slope caused by cell dropout. Since warning counter 19 is started immediately upon the calculation of an approximately +2 Current CSAV, the circuit mechanism for activating WL-1, WL-2 and even computer shutdown is initiated. However, since it is the Current CSAV that is calculated at the end of the warning period of 180 seconds that produces the warnings of WL-1 and WL-2, and the then Current CSAV is at a value below the WL-1 threshold, no warnings are issued. Thus, the circuitry is returned to its normal state where New SS(s) are calculated which produce Current CSAV(s) having a value of zero or less.

Figure 6C:
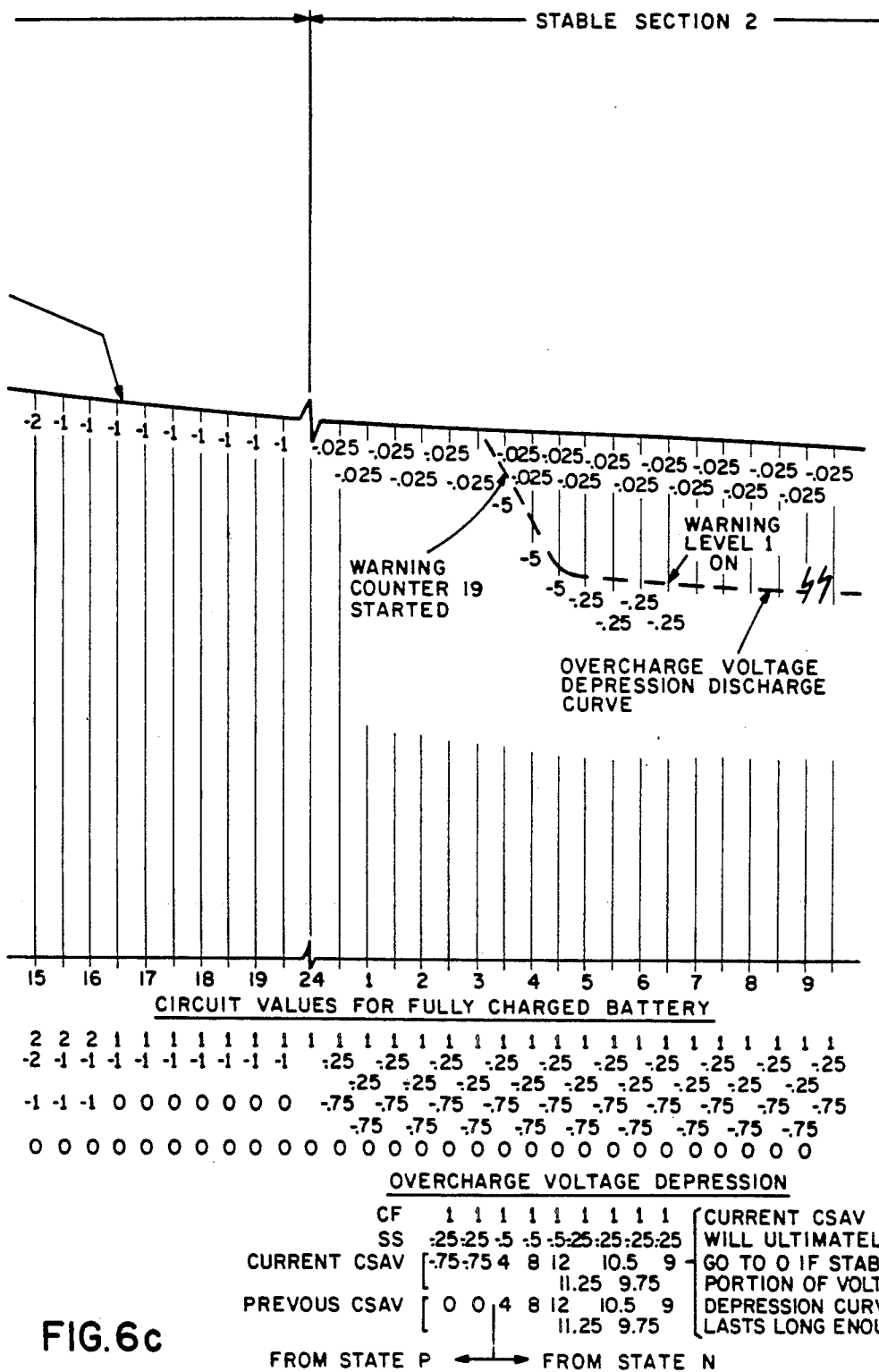
Figure 6D:
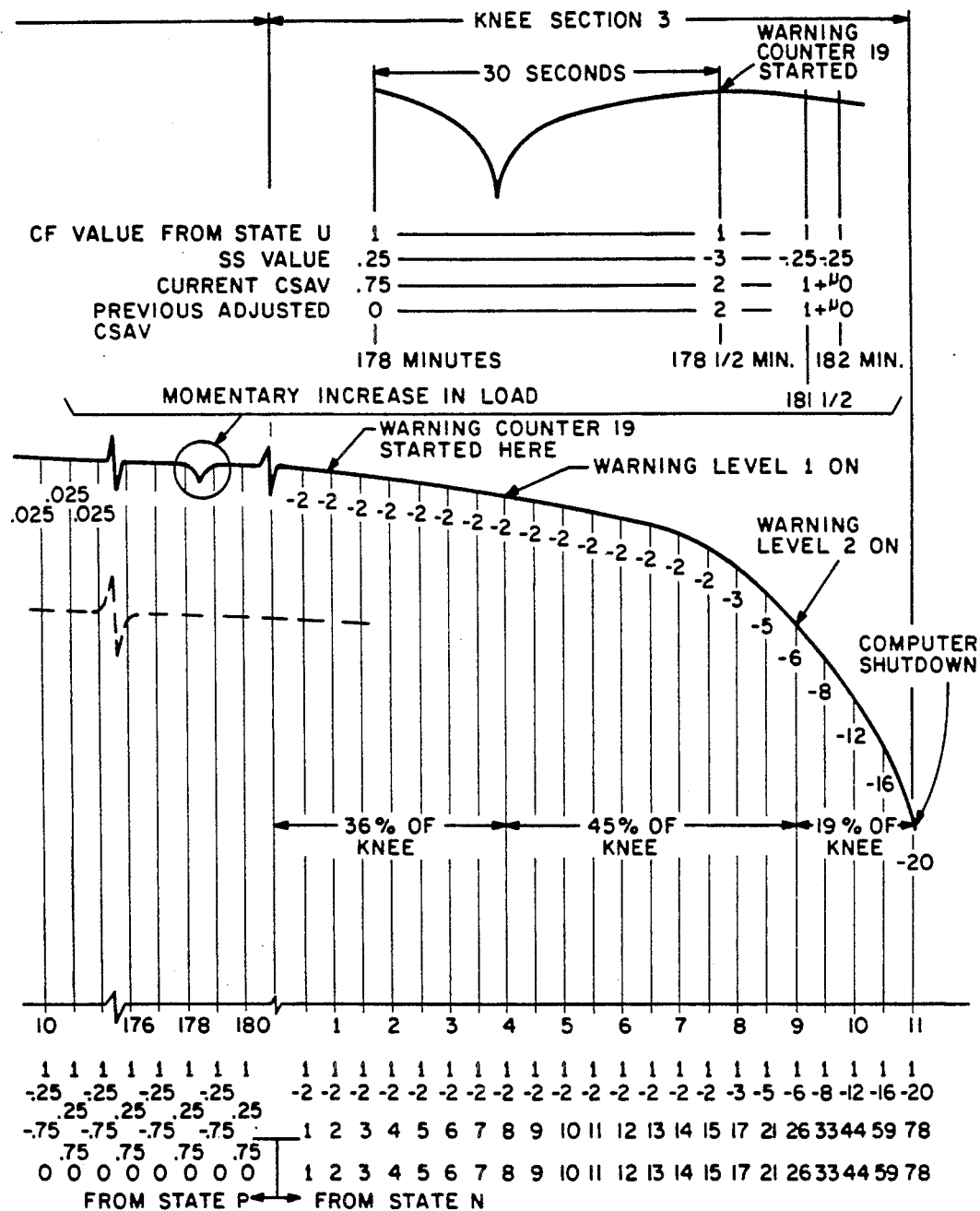

As is seen in FIG. 6d, which shows an enlarged view of the negative "spike" produced at about 178 minutes into Stable Section 2 of the discharge curve, a SS of −3 is calculated at 178 ½ minutes. This −3 SS value produces a Current CSAV at 178 ½ minutes of +2, which is at the threshold for triggering warning counter 19. However, at the end of the warning counter period occurring at 181 ½ minutes, the Current CSAV has returned to a +1 value which is below the WL-1 threshold. At 182 minutes the then current CSAV returns to a still lower zero value. Accordingly, the momentary negative spike produced by disk access produces no alarms or shutdowns.

The Mode of Operation During Discharge of a Battery Subject to Overcharge Voltage Depression An overcharge voltage depression is characterized by a discharge knee which is separated both timewise and capacitywise from complete battery discharge. Accordingly, useful battery capacity exists to continue computer operation until a Section 3 knee is reached. The circuitry of this invention distinguishes between the two knees-usually by returning Current CSAV to a value below +2 after a WL-1 warning is generated in the case of the overcharge voltage depression knee.

In the case of a Section 3 knee the CSAV(s) continue to build up, so that a WL-1 warning is followed by a WL-2 warning and ultimately computer shutdown.

As is shown in FIG. 6c, the knee of the particular overcharge voltage depression shown is characterized by SS values of −5 lasting for approximately ninety seconds. Thereafter, the discharge curve enters a stable section having SS(s) of −0.25.

With these values and time conditions characterizing an overcharge voltage depression knee, warning counter 19 is started at 3 minutes and 30 seconds when the Current CSAV reaches a +4 value. At the end of the warning counter time period of 180 seconds (6 minutes and 30 seconds) Current CSAV is a +9, thus triggering a WL-1 warning. This gives the computer operator notice that some type of knee has been detected. However, a WL-2 warning is never issued because the declining SS values produce a reduction in the CSAV(s). The actuation of only a single warning confirms to the operator that a Section 3 knee was not the cause of the WL-1 warning.

If the stable portion of the voltage depression curve lasts long enough, Current CSAV will ultimately go to zero.

CONCEPTS EMPLOYED IN THE CALCULATION OF CURRENT CSAV

The following equation for Current CSAV is designed to improve the monitoring of the voltage discharge curve and to produce warnings and system (computer) shutdown only in response to a knee section immediately preceding complete battery discharge:

Current CSAV = Previous Adjusted CSAV ± |New SS| − CF, or its equivalent

Current CSAV = Previous Adjusted CSAV − New SS − CF.

These equations introduce the terms Previous Adjusted CSAV, New SS and CF. And the circuitry embodying the algorithm for effecting the equation introduces time periods for taking a voltage sample (VS; 0.11 seconds), for taking a slope sample (SS; 30 seconds), for decrementing compensation factor (CF; 90 seconds), and for a warning period (180 seconds) the beginning and end of which a positive CSAV must be calculated at least equal to the WL-1 threshold before a warning and shutdown sequence can be initiated.

Each of the foregoing terms and times contributes to the monitoring efficiency and reliability of this invention. Although, if a loss of efficiency and reliability can be tolerated, certain steps could be eliminated from the algorithm, for example, the steps involving Previous Adjusted CSAV.

The principal concepts which underlie the above terms and times are briefly summarized as follows:

The Principal Underlying Compensation Factor (CF) and Slope Sample (SS)

As the system is unaware of the state of the battery at system powerup, compensation factor (CF) is a mechanism used to allow the system to ignore essentially the Startup Voltage Depression-Section 1 for the fully charged battery discharge curve by overwhelming numerically the actual slope of the discharge curve represented by the slope samples (SS). In particular, an examination of the numerical values for CF range between 20 and 8 and for SS a generally constant −4 during the first 5 minutes after powerup. Accordingly, the quantity (±|New SS|−CF), or its equivalent (−New SS−CF), yields negative values each time SS is calculated which in turn do not produce a positive Current CSAV of at least +2 required to trigger warning counter 19 so as to possibly enter the warning and shutdown sequence.

The term CF having performed its principal function during the initial portion of the startup voltage depression is decremented every 120 seconds until CF reaches a fixed value of +1 (FCF=+1) for the remaining portion of the normal discharge curve. The quantity (±|New SS|−CF) thus hovers at a value near zero, and in so doing places the system during Stable Section 2 and Knee Section 3 responsive to significantly large changes in SS which may be indicative of arrival of the voltage discharge at the negative knee of Knee Section 3 immediately preceding complete battery discharge.

Thus, CF at the outset masks SS so that the circuitry is not responsive to the fairly large negative slope values during the initial voltage depression at startup; but thereafter as CF is decremented to +1 (FCF) the values of the SS(s) are significant.

With respect to a partially charged battery, while SCF and CF ranges between +20 and +15 for the first 5 minutes, the relatively large SS(s) of −18 produce a positive Current CSAV at 2 ½ minutes after powerup thus activating warning counter 19 and leading into the warning and shutdown sequence.

Without the use of CF monitoring of the discharge curve slope, the system could not reliably distinguish between the range of voltage discharge slopes encountered during the initial startup voltage depression and those produced by the wide range of partially change batteries.

The Principal Underlying Current CSAV and Adjusted CSAV

The current CSAV provides a mechanism for the CPU to accurately track the knee sections immediately preceding complete battery discharge, characterized by large negative slopes, of both fully and partially charged batteries. If the Current CSAV exceeds the WL-1 threshold value then the CPU knows that the knee section immediately preceding complete discharge is probably approached. Thereafter, upon the expiration of the warning counter time period, if the Current CSAV(s) go to the higher levels required to exceed the WL-2 and SDV thresholds, the CPU knows that complete battery discharge is imminent.

While the use of the values represented by the term Previous Adjusted CSAV may be optional in a given battery discharge management system, it serves the purpose of amplifying at an earlier time in the monitoring process the positive values of the Current CSAV. Current CSAV is a real time value acted upon immediately, and Previous Adjusted CSAV is zero and is therefore nonconsequential in the system until a positive Current CSAV is detected in state 0. The Current CSAV becomes positive during 1) Knee Section 3 of a fully charged battery discharge curve, 2) the knee portion of a partially charged battery, 3) voltage depression due to battery overcharge, 4) cell dropout, and 5) negatively directed voltage aberrations caused by disk access and other momentarily applied loads.

With the dual requirement that positive Current CSAV(s) appear at both the start and end of the warning counter time period of 180 seconds, the circuitry responds by entering into the warning and possibly the shutdown sequence for conditions 1 and 2 above but rejects condition 3, 4 and 5 because they do not produce positive Current CSAV(s) at the end of the warning counter time period.

Accordingly, an inspection of both Current CSAV and Previous Adjusted CSAV values shows that during conditions 1 and above the term Previous Adjusted CSAV contributes a large positive number to the numerical values which collectively determine Current CSAV.

It should be understood that the above described apparatus and method ar merely illustrative of the principals and structural features of this invention and modifications can be made without departing from the scope of the invention.

What is claimed is:

1. Apparatus for managing a battery power supply connected to a load device using compensation for the rate of change of discharge voltage with respect to the elapse of time, comprising:

first means for generating a voltage-discharge value responsive to the rate of change of battery discharge voltage with respect to the elapse of time;

second means for generating a compensation-factor value which is generally numerically different from the voltage-discharge value;

third means for generating a compensated voltage-discharge value responsive to both the voltage-discharge value and the compensation-factor value; and means responsive to said third generating means for initiating a shutdown of said load device under predetermined conditions.

2. Apparatus for managing a battery power supply connected to a load device using compensation for the rate of change of discharge voltage with respect to the elapse of time, comprising:

first means for generating a voltage-discharge value responsive to the rate of change of battery discharge voltage with respect to the elapse of time;

second means for generating a compensation-factor value which is generally numerically different from the voltage-discharge value;

third means for generating a compensated voltage-discharge value responsive to both the voltage-discharge value and the compensation-factor value wherein the battery power supply is characterized by normal voltage-discharge curve with the power supply fully charged having a startup voltage depression section under load, and in which the absolute value of the compensation-factor value during at least the initial portion of the startup voltage depression is numerically several times greater than the absolute value of the voltage-discharge value during the same period; and means responsive to said third generating means for initiating a shutdown of said load device under predetermined conditions.

3. The apparatus of claim 2 in which the monitoring means is responsive during at least the initial portion of the startup voltage depression section to the numerical difference between the two absolute values.

4. The apparatus of claim 3 including means for decrementing the compensation-factor value during at least the initial portion of the startup voltage depression section.

5. The apparatus of claim 4 in which the compensation-factor value is periodically decremented to a predetermined fixed compensation-factor value with the time period separating successive steps of the decrementation being a fraction of the time period of the startup voltage depression section.

6. The apparatus of claim 5 in which the predetermined fixed compensation-factor value is equal to or approximately equal to the voltage-discharge value at a terminal portion of the startup voltage depression section.

7. The apparatus of claim 5 in which the voltage-discharge curve is further characterized by a stable voltage-discharge section following the startup voltage depression section, and in which the predetermined fixed compensation-factor value is approximately equal to the voltage-discharge value for at least the initial portion of the stable voltage section.

8. The apparatus of claim 5 in which the predetermined fixed compensation-factor value is slightly greater in absolute value than the absolute value of the voltage-discharge value for at least the initial portion of the stable voltage section.

9. The apparatus of claim 4 for managing a battery power supply which may be subject to a voltage-discharge knee induced by an overcharge voltage depression, including timing means for generating a predetermined time period approximately equal to or greater than the length of time that a voltage discharge knee would persist due to an overcharge voltage depression.

10. The apparatus of claim 9 including means for detecting a predetermined timer-starting value which is a first function of the compensated voltage-discharge value occurring during an initial portion of the voltage-discharge knee induced by a overcharge voltage depression.

11. The apparatus of claim 10 in which the timing means is activated in response to the detection of the predetermined timer-starting value occurring during the voltage-discharge knee induced by an overcharge voltage depression.

12. The apparatus of claim 11 in which a second function of the compensated voltage-discharge value is detected at the end of the time period generated by the timing means.

13. The apparatus of claim 12 in which the voltage-discharge curve is further characterized by a rapidly-declining voltage-knee section terminating in complete battery discharge and following timewise the stable voltage section, and including means for effecting battery power management depending upon the second function of the voltage-discharge value measured at the end of the time period generated by the timing means.

14. The apparatus of claim 13 in which the means for effecting battery power management includes means selectively operable to issue a warning signal of low battery capacity characteristic of a voltage-discharge curve knee section terminating in complete battery discharge, to shutdown the load device, or to prevent the issuance of a warning signal and shutdown depending upon the numerical value of the second function of the compensated voltage-discharge value measured at the end of the time period generated by the timing means.

15. The apparatus of claim 14 including means for establishing a first predetermined threshold value for the second function of the compensated voltage-discharge value for issuing a warning signal and also a second predetermined threshold value for the second function of the compensated voltage-discharge value for shutting down the load device, and in which the selectively operable means returns the monitoring means to measuring compensated voltage-discharge values characterized by relatively constant voltage-discharge values if neither of the threshold values are exceeded at the end of the time period generated by the timing means.

16. The apparatus of claim 13 in which the means for effecting battery power management includes means selectively operable to issue at least two successive warning signals of low battery capacity characteristic of a voltage-discharge curve knee section terminating in complete battery discharge, to shutdown the load device, or to prevent the issuance of any warning signal and shutdown depending upon the particular numerical values for the second function of the compensated voltage-discharge values measured during a time period starting with and following the end of the time period generated by the timing means.

17. The apparatus of claim 16 in which each warning signal and shutdown is activated by different ranges of numerical values for the second function of the compensated voltage-discharge values with each range having a successively larger threshold value of activation.

18. The apparatus of claim 17 in which selectively operable means returns the monitoring means to measuring compensated voltage-discharge values characterized by relatively constant voltage-discharge values if none of the threshold values are exceeded at the end of the time period generated by the timing means.

19. Apparatus for monitoring a battery power supply, which has a normal voltage-discharge curve when connected to a load device, characterized by an initial startup voltage depression section, followed by a stable voltage section and ending with a rapidly declining voltage knee section terminating in loss of battery capacity, comprising:

first means for generating a voltage-discharge value (SS) responsive to the rate of change of battery discharge voltage with respect to the elapse of time while the battery power supply is under load;

second means for generating a compensation-factor value (CF) which is numerically different than the voltage-discharge value during at least the initial portion of the startup voltage depression section;

third means for generating a compensated voltage-discharge value (CSAV) is a function of the voltage-discharge factor (SS) and the compensation-factor value (CF) in accordance with the functional expression $$CSAV = [(f)X]f(SS-CF)$$

during at least the initial portion of the startup voltage depression; and means responsive to said third generating means for initiating a shutdown of said load device under predetermined conditions.

20. Apparatus for monitoring a battery power supply, which has a normal voltage-discharge curve when connected to a load device, characterized by an initial startup voltage depression section, followed by a stable voltage section and ending with a rapidly declining voltage knee section terminating in loss of battery capacity, comprising:

first means for generating a voltage-discharge value (SS) responsive to the rate of change of battery discharge voltage with respective to the elapse of time while the battery supply is under load;

second means for generating a compensation-factor value (CF) which is numerically different than the voltage-discharge value during at least the initial portion of the startup voltage depression section;

third means for generating a compensated voltage-discharge value (CSAV) as a function of the voltage-discharge factor (SS) and the compensation-factor (CF) in accordance with the functional expression $$CSAV = [(f)X]f(SS-CF)$$

during at least the initial portion of the startup voltage depression wherein the absolute value of the initial CF at startup of battery discharge (start up compensation-factor (SCF)) is numerically greater than the absolute value of SS during the same time; and means responsive to said third generating means for initiating a shutdown of said load device under predetermined conditions.

21. The apparatus of claim 20 in which the SCF is decremented periodically during the startup voltage depression section of a fully charged battery following a normal startup depression curve.

22. The apparatus of claim 21 in which the SCF is decremented until it reaches a predetermined fixed compensation value (FCF).

23. The apparatus of claim 22 in which the predetermined FCF is approximately equal to the SS of the terminal relatively-stable portion of the startup voltage depression section.

24. The apparatus of claim 22 in which the SCF is decremented to a FCF which approaches in value the SS of the voltage-discharge curve.

25. The apparatus of claim 22 in which the FCF is maintained at its fixed value throughout the stable voltage section of the voltage-discharge curve.

26. The apparatus of claim 25 in which the FCF is maintained at its fixed value throughout the rapidly-declining voltage knee section of the voltage-discharge curve.

27. Apparatus for monitoring and managing a battery power supply, which has normal voltage-discharge curve when fully charged and connected to a load device, characterized by an initial startup voltage depression section, followed by a stable voltage section, and ending with a rapidly declining voltage knee section terminating in loss of battery capacity, comprising:

first means for generating periodically at a first rate a voltage-discharge value (SS) indicative of the rate of change of battery discharge voltage with respect to the elapse of time while the battery power supply is under load;

second means for generating periodically at the first rate a compensation-factor value (CF) which is numerically larger in absolute value than the absolute value of SS during at least the initial portion of the startup voltage depression and is thereafter periodically decremented at a second rate until CF reaches a predetermined fixed value (FCF) approaching the SS of the stable section of the voltage-discharge curve;

third means for generating periodically at the first rate a real-time compensated voltage-discharge value (CSAV) as a function of the voltage-discharge factor (SS) and the compensation-factor (CF) in accordance with the functional expression $$\text{Real-time } CSAV = \\ [(f)X]f(SS - CF \text{ (both values previously taken and} \\ \text{adjusted one period earlier at the first rate))} - \\ (SS - CF \text{ (both values taken in real time))},$$

where SS is treated as a positive number for declining-voltage-discharge and as a negative number for increasing-voltage-discharge, where the previously taken quantity (SS−CF) is adjusted to a first fixed value if the quantity is otherwise less than the first fixed value; and means responsive to said third means for initiating a shutdown of said load device under predetermined conditions.

28. The apparatus of claim 27 including timing means for specifying a warning-signal time period, and means for activating the timing means in response to the real-time CSAV reaching a predetermined threshold value.

29. The apparatus of claim 28 including means for measuring the real-time CSAV at the end of the warning-signal time period.

30. The apparatus of claim 29 including means for triggering a warning signal (WL-1) in the event the real-time CSAV at the end of the warning-signal time period is equal to or greater than a predetermined WL-1 threshold value.

31. The apparatus of claim 30 including means for returning the monitoring and management means to measuring real-time CASV(s) characterized by relatively constant SS(s) in the event the WL-1 threshold value is not attained.

32. The apparatus of claim 29 including means for triggering a first warning signal (WL-1) in the event the real-time CSAV at the end of the warning-signal time period is within a first range of CSAV(s), and for triggering a second warning signal (WL-2) in the event the real-time CSAV at the end of the warning-signal time period is within a second and higher range of real-time CSAV(s).

33. The apparatus of claim 29 in which the triggering means also triggers a load device shutdown signal (SDV) in the event the real-time CSAV at the end of the warning-signal time period is within a third and still higher range of CSAV(s).

34. The apparatus of claim 32 in which the warning-signal time period is at least approximately equal to the time period of the declining voltage-discharge knee of an overcharge voltage depression.

35. The apparatus of claim 28 including means for selectively triggering a first warning signal (WL-1), a second warning signal (WL-2), a load-device shutdown signal, and a (SDV) in time progression in the event the real-time CSAV at the end of the warning-signal time period is equal to or greater than a predetermined WL-1 threshold value and thereafter the real-time CSAV progressively increases to equal or exceed a WL-2 threshold value and thereafter to equal or exceed a SDV threshold value.

36. The apparatus of claim 35 in which the selective triggering means returns the monitoring and management means to measure real-times CSAV's characteristic of relatively stable SS(s) in the event the real-time CSAV measured at the end of the warning-signal time period fails to reach the WL-1 threshold value.

37. The apparatus of claim 35 in which the otherwise normal voltage-discharge curve of the battery power supply may be subjected to an overcharge voltage depression section characterized by a declining voltage-discharge knee followed by a period of relatively stable voltage discharge, and in which the timing means is activated in response to the real-time CSAV reaching the predetermined threshold value for activation in response to the power supply discharge passing through an overcharge voltage-discharge knee.

38. The apparatus of claim 37 in which the selective triggering means is deactivated at the end of the warning-signal time period in response to the measurement of a real-time CSAV less than the WL-1 threshold value.

39. The apparatus of claim 35 in which the otherwise normal discharge curve of a fully charged battery is abridged due to partial charging of the battery power supply with the result that the rapidly-declining voltage knee section terminating in loss of battery capacity is arrived at prematurely, including means for selectively reducing the number of times CF is periodically decremented thereby to start the warning counter time period earlier timewise than for a normal discharge curve.

40. Apparatus for monitoring and managing a battery power supply, which has a normal voltage-discharge curve when fully charged and connected to a load device, characterized by an initial startup voltage depression section, followed by a stable voltage section, and ending with a rapidly declining voltage knee section terminating in loss of battery capacity, comprising:
  first means for generating periodically at a first rate a voltage-discharge value (SS) indicative of the rate of change of battery discharge voltage with respect to the elapse of time while the battery power supply is under load;
  second means for generating periodically at the first rate a compensation-factor value (CF) which is numerically larger in absolute value than the absolute value of SS during at least the initial portion of the startup voltage depression and is thereafter periodically decremented at a second rate until CF reaches a predetermined fixed value (FCF) approaching the SS of the stable section of the voltage-discharge curve;
  third means for generating periodically at the first rate a real-time compensated voltage-discharge value (CSAV) as a function of the voltage-discharge factor (SS) and the compensation-factor (CF) in accordance with the functional expression $$\text{Real-time } CSAV = \int [SS - CF \text{ (both values previously taken and adjusted one period earlier at the first rate)}] - [SS - CF \text{ (both values taken in real time)}]$$

where SS is treated as a positive number for declining-voltage-discharge and as a negative number for increasing-voltage-discharge, and where the previously-taken quantity (SS−CF) is adjusted to a first fixed value if the quantity is otherwise less than the first fixed value
  wherein the adjusted first fixed value is zero; and
  means responsive to said third means for initiating a shutdown of said load device under predetermined conditions.

41. The method of managing a battery power supply connected to a load device which is energized by the battery power supply using compensation for the rate of change of discharge voltage with respect to a specified criteria, comprising:
  generating a voltage-discharge value responsive to the rate of change of battery discharge voltage with respect to a specified criteria;
  generating a compensation-factor value which is generally numerically different than the voltage-discharge value;
  generating a compensated voltage-discharge value responsive to both the voltage-discharge value and the compensation-factor value for monitoring the battery discharge voltage; and
  utilizing said compensated voltage-discharge value to initiate a shutdown of said load device under predetermined conditions.

42. The method of managing a battery power supply connected to a load device which is energized by the battery power supply using compensation for the rate of change of discharge voltage with respect to a specified criteria, comprising;
  generating a voltage-discharge value responsive to the rate of change of battery discharge voltage with respect to a specified criteria;

generating a compensation-factor value which is generally numerically different than the voltage-discharge value;

generating a compensated voltage-discharge value responsive to both the voltage-discharge value and the compensation-factor value for monitoring the battery discharge voltage, wherein the battery power supply is characterized by a voltage-discharge curve having a startup voltage depression under load, and in which the absolute value of the compensation-factor value during at least the initial portion of the startup voltage depression is numerically several times greater than the absolute value of the voltage-discharge value during the same time period; and utilizing said compensated voltage-discharge value to initiate a shutdown of said load device under predetermined conditions.

43. The method of claim 42 in which the monitoring step is responsive during at least the initial portion of the startup voltage depression to the numerical difference between the two absolute values.

44. The method of claim 43 including decrementing the compensation-factor value during at least the initial portion of the startup voltage depression.

45. The method of claim 44 in which the compensation-factor value is periodically decremented to a predetermined fixed value with the time period separating successive steps of the decrementation being a fraction of the time period of the startup voltage depression.

46. The method of claim 45 in which the predetermined fixed compensation-factor value is equal to or approximately equal to the voltage-discharge value at a terminal portion of the startup voltage depression section.

47. The method of claim 45 in which the voltage-discharge curve is further characterized by a stable voltage-discharge section following the startup voltage depression section, and in which the predetermined fixed compensation factor value is approximately equal to the voltage-discharge value for at least the initial portion of the stable voltage section.

48. The method of claim 45 in which the predetermined fixed compensation-factor value is slightly greater in absolute value than the absolute-value of the voltage-discharge value for at least the initial portion of the stable voltage section.

49. The method of claim 44 for managing a battery power supply which may be subject to a voltage-discharge knee induced by an overcharge voltage depression, including generating a predetermined time period approximately equal to or greater than the length of time that a voltage discharge knee would persist due to an overcharge voltage depression.

50. The method of claim 49 including detecting a predetermined compensated voltage discharge value occurring during an initial portion of the voltage-discharge knee induced by an overcharge voltage depression.

51. The method of claim 50 in which the generated time period is activated in response to the detection of the predetermined compensated voltage-discharge value occurring during the voltage-discharge knee induced by an overcharge voltage depression.

52. The method of claim 51 in which the compensated voltage-discharge value is measured at the end of the generated time period.

53. The method of claim 52 in which the voltage-discharge curve is further characterized by a rapidly-declining voltage knee section terminating in complete battery discharge and following timewise the stable voltage section, and effecting battery power management depending upon the voltage-discharge value measured at the end of the generated time period.

54. The method of claim 53 in which effecting battery power management includes selectively issuing a warning signal of low battery capacity characteristic of a voltage-discharge curve knee section terminating in complete battery discharge, shutting down the load device, or preventing the issuance of a warning signal and shutdown depending upon the numerical value of the second function of the compensated voltage-discharge value measured at the end of the generated time period.

55. The method of claim 54 including establishing a predetermined compensated voltage-discharge value for issuing a warning signal and also a predetermined compensated voltage-discharge threshold value for shutting down the load device, and in which compensated voltage-discharge values characterized by relatively constant voltage-discharge values are measured if neither of the threshold values are exceeded at the end of the generated time period.

56. The method of claim 53 includes operating selectively at least two successive warning signals of low battery capacity characteristic of a voltage-discharge curve knee section terminating in complete battery discharge, shutting down the load device, or preventing the issuance of any warning signal and shutdown depending upon the particular compensated voltage-discharge value measured at the end of the generated time period.

57. The method of claim 56 in which each warning signal and shutdown is activated by different ranges of compensated voltage-discharge values with each range having a successively larger threshold value of activation.

58. The method of claim 57 in which voltage-discharge values characterized by relatively constant voltage-discharge values are measured if none of the threshold values are exceeded at the end of the generated time period.

59. The method of monitoring a battery power supply connected to a load device which is energized by the battery power supply which has a voltage-discharge curve characterized by an initial startup voltage depression section, followed by a stable voltage section and ending with a rapidly declining voltage knee section terminating in loss of battery capacity, comprising:

generating a voltage-discharge value (SS) responsive to the rate of change of battery discharge voltage with respect to the elapse of time while the battery power supply is under load;

generating a compensation-factor value (CF) which is numerically different than the voltage-discharge value during at least the initial portion of the startup voltage depression;

generating a compensated voltage-discharge value (CSAV) as a function of the voltage-discharge value (SS) and the compensation-factor value (CF) in accordance with the functional expression $$[SCAV]CSAV = [(f)x](SS - CF)$$

during at least the initial portion of the startup voltage depression; and utilizing said compensated voltage-discharge value to initiate a shutdown of said load device under predetermined conditions.

60. The method of monitoring a battery power supply connected to a load device which is energized by the battery power supply which has a voltage-discharge curve characterized by an initial startup voltage depression section, followed by a stable voltage section and ending with a rapidly declining voltage knee section terminating in loss of battery capacity, comprising;

generating a voltage-discharge value (SS) responsive to the rate of change of battery discharge voltage with respect to the elapse of time while the battery power supply is under load;

generating a compensation-factor value (CF) which is numerically different than the voltage-discharge value during at least the initial portion of the startup voltage depression;

generating a compensated voltage-discharge value (CSAV) as a function of the voltage-discharge value (SS) and the compensation (CF) in accordance with the functional expression

[SCAV]CSAV = [(f)X]f(SS−CF)

during at least the initial portion of the startup voltage depression wherein the absolute value of the initial CF at startup of battery discharge (startup compensation factor (SCF)) is numerically greater than the absolute value of SS during the same time; and utilizing said compensated voltage-discharge value (CSAV) to initiate a shutdown of said load device under predetermined conditions.

61. The method of claim 60 in which the SCF is decremented periodically during the startup voltage depression section of a fully charged battery following a normal startup depression curve.

62. The method of claim 61 in which the SCF is decremented until it reaches a predetermined fixed compensation value (FCF).

63. The method of claim 62 in which the predetermined FCF is approximately equal to the SS of the terminal and relatively stable portion of the startup voltage depression section.

64. The method of claim 62 in which the SCF is decremented to a FCF which approaches in value the SS of the voltage-discharge curve.

65. The method of claim 62 in which the FCF is maintained at its fixed value throughout the stable voltage section of the voltage-discharge curve.

66. The method of claim 65 in which the FCF is maintained at its fixed value throughout the rapidly-declining voltage knee section of the voltage-discharge curve.

67. The method of monitoring and managing a battery power supply, which has a normal voltage-discharge curve when fully charged and connected to a load device, characterized by an initial startup voltage depression section, followed by a stable voltage section and ending with a rapidly declining voltage knee section terminating in loss of battery capacity, comprising:

generating periodically at a first rate a voltage-discharge value (SS) indicative of the rate of change of battery discharge voltage with respect to the elapse of time while the battery power supply is under load;

generating periodically at the first rate a compensation-factor value (CF) which is numerically larger in absolute value than the absolute value of SS during at least the initial portion of the startup voltage depression and which is thereafter periodically decremented at a second rate until CF reaches a predetermined fixed value (FCF) approaching the SS of the stable section of the voltage-discharge curve;

generating periodically at the first rate a real-time compensated voltage-discharge value (CSAV) as a function of the voltage-discharge value (SS) and the compensation-factor (CF) in accordance with the functional expression Real-time $CSAV =$ $[(f)X]f(SS - CF$ (both values previously taken and adjusted one period earlier at the first rate)) −

$(SS - CF$ (both values taken in real time))

where SS is treated as a positive number for declining-voltage-discharge and as a negative number for increasing-voltage-discharge, and where the previously taken quantity (SS−CF) is adjusted to a first fixed value if the quantity is otherwise less than the first fixed value numerically; and utilizing said compensated voltage-discharge value (CSAV) to initiate a shutdown of said load device under predetermined conditions.

* * * * *